(12) United States Patent
Kim et al.

(10) Patent No.: US 9,972,538 B2
(45) Date of Patent: May 15, 2018

(54) METHODS FOR FABRICATING SEMICONDUCTOR DEVICE

(71) Applicant: Samsung Electronics Co., Ltd., Suwon-si, Gyeonggi-do (KR)

(72) Inventors: Cheol Kim, Hwaseong-si (KR); Dong-Hoon Khang, Daegu (KR); Do-Hyoung Kim, Hwaseong-si (KR); Seung-Jin Mun, Suwon-si (KR); Yong-Joon Choi, Suwon-si (KR); Seung-Mo Ha, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/196,870

(22) Filed: Jun. 29, 2016

(65) Prior Publication Data

US 2017/0040221 A1     Feb. 9, 2017

(30) Foreign Application Priority Data

Aug. 3, 2015  (KR) .................. 10-2015-0109463

(51) Int. Cl.
| | |
|---|---|
| *H01L 21/311* | (2006.01) |
| *H01L 21/8234* | (2006.01) |
| *H01L 21/027* | (2006.01) |
| *H01L 21/02* | (2006.01) |
| *H01L 21/3115* | (2006.01) |
| *H01L 21/3105* | (2006.01) |
| *H01L 21/033* | (2006.01) |
| *H01L 21/308* | (2006.01) |
| *H01L 29/66* | (2006.01) |

(52) U.S. Cl.
CPC .. *H01L 21/823431* (2013.01); *H01L 21/0234* (2013.01); *H01L 21/0275* (2013.01); *H01L 21/02115* (2013.01); *H01L 21/02271* (2013.01); *H01L 21/02321* (2013.01); *H01L 21/02323* (2013.01); *H01L 21/0337* (2013.01); *H01L 21/3086* (2013.01); *H01L 21/31058* (2013.01); *H01L 21/31155* (2013.01); *H01L 29/66795* (2013.01)

(58) Field of Classification Search
CPC ......... H01L 21/31058; H01L 21/31056; H01L 21/0275; H01L 21/02115; H01L 21/31155
USPC .................................. 438/696, 717, 725, 736
See application file for complete search history.

(56) References Cited

U.S. PATENT DOCUMENTS

| | | |
|---|---|---|
| 6,586,163 B1 | 7/2003 | Okabe et al. |
| 6,764,946 B1 | 7/2004 | Amblard |
| 7,064,078 B2 | 6/2006 | Liu et al. |
| 7,273,815 B2 | 9/2007 | Sadjadi et al. |

(Continued)

FOREIGN PATENT DOCUMENTS

| | | |
|---|---|---|
| EP | 2540780 A1 | 1/2013 |
| JP | 2013110437 A | 6/2013 |

(Continued)

*Primary Examiner* — Binh X Tran
(74) *Attorney, Agent, or Firm* — Harness, Dickey & Pierce, P.L.C.

(57) ABSTRACT

Methods for fabricating a semiconductor device include forming a composite film, forming a rough pattern on the composite film, forming a smooth pattern by subjecting the rough pattern to ion implantation and a plasma treatment, and patterning the composite film using the smooth pattern as a first mask.

17 Claims, 19 Drawing Sheets

(56) References Cited

U.S. PATENT DOCUMENTS

| | | | |
|---|---|---|---|
| 7,368,226 B2 | 5/2008 | Bae | |
| 8,133,804 B1 * | 3/2012 | Godet | H01J 37/3056 |
| | | | 257/E21.235 |
| 8,524,608 B1 | 9/2013 | Kuo et al. | |
| 8,900,937 B2 | 12/2014 | Lin et al. | |
| 8,951,917 B2 | 2/2015 | Ogihara et al. | |
| 8,951,918 B2 | 2/2015 | Li et al. | |
| 2007/0284690 A1 | 12/2007 | Sadjadi et al. | |
| 2008/0182419 A1 * | 7/2008 | Yasui | H01L 21/0273 |
| | | | 438/710 |
| 2014/0206194 A1 | 7/2014 | Lee et al. | |
| 2015/0126042 A1 * | 5/2015 | Pasquale | H01L 21/02274 |
| | | | 438/761 |
| 2015/0160555 A1 | 6/2015 | Sugiyama et al. | |
| 2015/0247238 A1 * | 9/2015 | Pasquale | C23C 16/4408 |
| | | | 438/785 |
| 2015/0253659 A1 * | 9/2015 | Inanami | G03F 1/38 |
| | | | 430/5 |

FOREIGN PATENT DOCUMENTS

| | | | |
|---|---|---|---|
| JP | 2013541845 A | 11/2013 | |
| KR | 20130002275 A | 1/2013 | |
| KR | 20150020202 A | 2/2015 | |
| WO | WO-2007021540 A2 | 2/2007 | |
| WO | WO-2012044677 A1 | 4/2012 | |
| WO | WO-2014024633 A1 | 2/2014 | |

\* cited by examiner

METHODS FOR FABRICATING SEMICONDUCTOR DEVICE

CROSS-REFERENCE TO RELATED APPLICATION

This application claims priority from Korean Patent Application No. 10-2015-0109463 filed on Aug. 3, 2015 in the Korean Intellectual Property Office, and all the benefits accruing therefrom under 35 U.S.C. 119, the contents of which in its entirety are herein incorporated by reference.

BACKGROUND

Technical Field

Example embodiments of the present disclosure relate to methods for fabricating a semiconductor device.

Description of the Related Art

As miniaturization of the semiconductor device increases, uniformity in the widths of the patterns inside of the semiconductor device can affect the intervals of the patterns or thickness thereof. Specifically, due to the resolution limits, the line edge roughness (LER) of a linear pattern has become an important factor to consider, to achieve reliability of the semiconductor device patterned by photolithography.

SUMMARY

Example embodiments of the present disclosure relate to methods for fabricating a semiconductor device having enhanced line edge roughness of a pattern.

According to some example embodiments of the present inventive concepts, there is provided a method for fabricating a semiconductor device, the method including forming a composite film, forming a rough pattern on the composite film, forming a smooth pattern by subjecting the rough pattern to ion implantation and plasma treatment and patterning the composite film using the smooth pattern as a first mask.

The rough pattern may have a line edge roughness (LER) greater than a LER of the smooth pattern.

The forming a rough pattern may comprise forming a photo resist (PR).

The forming a rough pattern may comprise forming a mask film on the composite film, forming a shielding film partially exposing the mask film, and subjecting the exposed mask film to exposure.

The subjecting the exposed mask film to exposure may comprise irradiating an argon fluoride (ArF) laser or an extreme ultra violet (EUV) laser.

The forming a rough pattern may comprise forming an amorphous carbon layer (ACL).

The forming a rough pattern may comprise depositing the rough pattern by chemical vapor deposition (CVD).

The subjecting the rough pattern to ion implantation may include applying ions selected from at least one of C, Ar, $H_2$ and $O_2$ to the rough pattern.

The subjecting the rough pattern to a plasma treatment may comprise using HBr or He plasma.

The ion implantation and the plasma treatment may be performed in-situ.

The forming a composite film may comprise forming a hard mask film and a first sacrificial layer on the hard mask film. The patterning the composite film using the smooth pattern as a first mask may comprise forming a first sacrificial pattern by patterning the first sacrificial layer, forming a first spacer on a sidewall of the first sacrificial pattern, and patterning the hard mask film using the first spacer as a second mask.

The forming a composite film may further comprise forming a second sacrificial layer on the first sacrificial layer. The forming a first sacrificial pattern may comprise forming a second sacrificial pattern by patterning the second sacrificial layer using the smooth pattern as the first mask, and forming a second spacer on a sidewall of the second sacrificial pattern, and wherein the forming a first sacrificial pattern by patterning the first sacrificial layer includes using the second spacer as a third mask.

According to some example embodiments of the present inventive concepts, there is provided a method for fabricating a semiconductor device, the method comprising forming a hard mask film and a first sacrificial layer sequentially on a substrate, forming a rough pattern on the first sacrificial layer, forming a smooth pattern by subjecting be rough pattern to ion implantation and plasma treatment, forming a first sacrificial pattern by patterning the first sacrificial layer using the smooth pattern as a first mask, forming a first spacer on a sidewall of the first sacrificial pattern, forming a hard mask pattern by patterning the hard mask film using the first spacer as a second mask, and forming a first fin-type pattern and a second fin-type pattern by patterning the substrate using the hard mask pattern as a third mask, a distance between the first fin-type pattern and the second fin-type pattern being equal to a width of the first sacrificial pattern.

The method may further comprise forming a second sacrificial layer on the first sacrificial layer, the rough pattern being formed on the second sacrificial layer. The forming the first sacrificial pattern may comprise forming a second sacrificial pattern by patterning the second sacrificial layer using the smooth pattern as the first mask, and forming a second spacer on a sidewall of the second sacrificial pattern, the forming a first sacrificial pattern by patterning the first sacrificial layer further includes using the second spacer as a third mask.

The method may further comprise forming a second sacrificial layer on the first sacrificial layer in a first region of the substrate, the rough pattern being formed on the second sacrificial layer. The forming a smooth pattern may comprise forming a first smooth pattern by performing the ion implantation and the plasma treatment in the first region, and forming a second smooth pattern by performing the plasma treatment in a second region of the substrate. The forming a first sacrificial pattern may comprise forming, in the first region, a second sacrificial pattern by patterning the second sacrificial layer using the first smooth pattern as a third mask, forming a second spacer on a sidewall of the second sacrificial pattern, the patterning the first sacrificial layer further including using the second spacer as a fourth mask, and forming, in the second region, a first sacrificial pattern by patterning the first sacrificial layer using the second smooth pattern as a fifth mask.

According to example embodiments, a method of fabricating a semiconductor device includes reducing a line edge roughness (LER) of a rough pattern, using ion implantation and a plasma treatment, to form a smooth pattern, the rough pattern being on a composite film, and the composite film being on a substrate; patterning the composite film using the smooth pattern as a first mask to form a composite pattern; and patterning the substrate using the composite pattern as a second mask to form a fin-type pattern.

The reducing a line edge roughness (LER) of the rough pattern may include (i) reducing the LER of the rough pattern to form a first smooth pattern, and (ii) reducing a LER of the first smooth pattern to form a second smooth pattern.

The reducing the LER of the rough pattern may include implanting ions in the rough pattern, and the reducing the LER of the first smooth pattern may include performing the plasma treatment on the first smooth pattern.

The reducing the LER of the rough pattern may include performing the plasma treatment on the rough pattern. The reducing the LER of the first smooth pattern may include implanting ions in the first smooth pattern.

The method may include providing a first rough pattern on a first region of the composite film, the first region including a first sacrificial layer and a hard mask film, and providing a second rough pattern on a second region of the composite film, the second region including a second sacrificial layer, the first sacrificial layer, and the hard mask film. The reducing a line edge roughness (LER) of the rough pattern may include reducing a LER of the first and second rough patterns by implanting ions in the first and second rough patterns to form a first smooth pattern and a second smooth pattern, respectively, providing a shielding film over the first smooth pattern, and reducing a LER of the second smooth pattern performing the plasma treatment on the second smooth pattern.

BRIEF DESCRIPTION OF THE DRAWINGS

Example embodiments will be more clearly understood from the following detailed description taken in conjunction with the accompanying drawings.

FIGS. 1 to 14 are views illustrating intermediate stages of fabrication, provided to explain a method for fabricating a semiconductor device according to some example embodiments;

FIGS. 15 to 17 are views illustrating intermediate stages of fabrication, provided to explain a method for fabricating a semiconductor device according to some example embodiments;

FIGS. 18 to 26 are views illustrating intermediate stages of fabrication, provided to explain a method for fabricating a semiconductor device according to some example embodiments;

FIGS. 27 to 39 are views illustrating intermediate stages of fabrication, provided to explain a method for fabricating a semiconductor device according to some example embodiments; and FIG. 40 is a block diagram of an electronic system comprising a semiconductor device fabricated according to a method for fabricating a semiconductor device according to some example embodiments.

DETAILED DESCRIPTION

Figure 1:
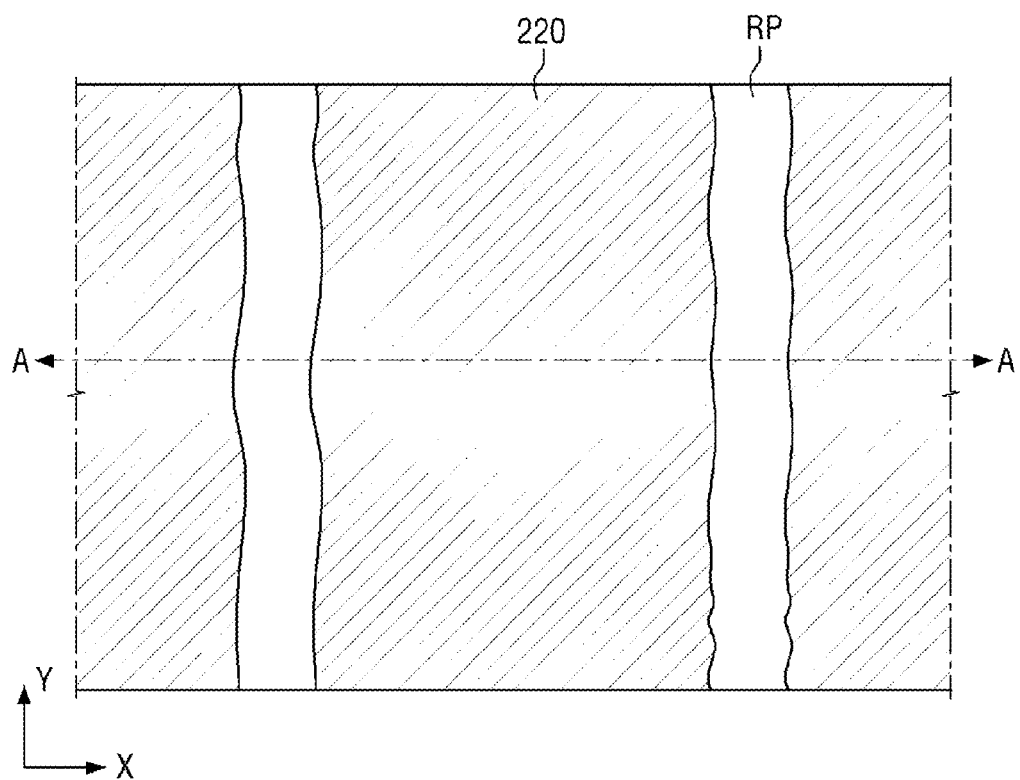
FIGS. 1-40 represent non-limiting, example embodiments as described herein.

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope.

In the drawings, the thicknesses of layers and regions may be exaggerated for clarity, and like numbers refer to like elements throughout the description of the figures.

Although the terms first, second, etc., may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being ibe various elements, these elements should not be limited by these terms. These term to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "t will be understood that, The terminology used herein is for the purpose of describing particular embodiments only and is not intended to be limiting of example embodiments. As used herein, the singular forms ning elements may" are intended to include the plural forms as well, unless the context clearly indicates otherwise. It will be further understood that the terms only ises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms e.g., or the purpose of describing particular embodiments only and is not intended to be limiting of example embodiments. As used herein, the singular forms "a," "an" and "the" are intended to include the plural forms as well, un it will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Although corresponding plan views and/or perspective views of some cross-sectional vie s may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Herein below, a method for fabricating a semiconductor device according to some example embodiments will be explained with reference to FIGS. 1 to 14.

Figure 2:
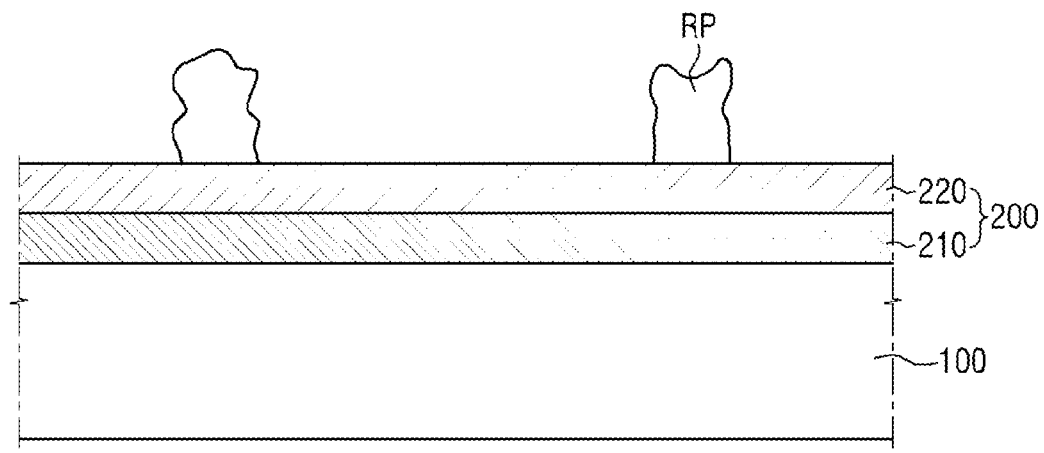

FIGS. 1 to 14 are views illustrating intermediate stages of fabrication, provided to explain a method for fabricating a semiconductor device according to some example embodiments. FIG. 2 is a cross sectional view taken on line A-A of FIG. 1, and FIG. 7 is a cross sectional view taken on line B-B of FIG. 6, Referring to FIGS. 1 and 2, a composite film 200 is formed on a substrate 100. The composite film 200 includes a hard mask film 210 and a first sacrificial layer 220. The hard mask film 210 and the first sacrificial layer 220 may be stacked in sequence on the substrate 100. Specifically, the hard mask film 210 may be formed on the substrate 100 and the first sacrificial layer 220 may be formed on the hard mask film 210.

The substrate 100 may be a silicon substrate, a bulk silicon or a silicon-on-insulator (SOI), for example. Alternatively, the substrate 100 may include an element semiconductor such as germanium, or a compound semiconductor such as a IV-IV group compound semiconductor or a group compound semiconductor, for example. Alternatively, the substrate 100 may be a base substrate having an epitaxial layer formed thereon.

Take the IV-IV group compound semiconductor for instance, this may be a binary compound or a ternary compound including at least two or more of carbon (C), silicon (Si), germanium (Ge), and tin (Sn), or such binary or ternary compound doped with a IV group element.

Take a III-V group compound semiconductor for instance, this may be one of a binary compound, ternary compound and quaternary compound which is formed by a combination of at least one of aluminum (Al), gallium (Ga), and indium (In) as a III group element, with one of phosphorus (P), arsenic and antimony (Sb) as a V group element.

The hard mask film 210 may include silicon nitride $Si_xN_y$. For example, the hard mask film 210 may include $Si_3N_4$. Alternatively, the hard mask film 210 may include $SiO_2$. In some example embodiments, the hard mask film 210 may be formed of a plurality of layers. The plurality of layers may each include at least one of silicon-containing material such as silicon oxide ($SiO_x$), silicon oxynitride (SiON), silicon nitride ($Si_xN_y$), tetraethyl orthosilicate (TEOS) or polycrystalline silicon, carbon-containing material such as amorphous carbon layer (ACL) or spin-on hardmask (SOH) and metal. However, example embodiments are not limited to the example given above.

The first sacrificial layer 220 may include any one of polycrystalline silicon, ACL and SOH.

Although not illustrated in FIG. 2, anti-reflection layers may be formed between the hard mask film 210 and the first sacrificial layer 220, and between the first sacrificial layer 220 and a rough pattern RP. The anti-reflection layer may be formed of silicon oxynitride film (SiON). The anti-reflection layers are the layers provided to prevent reflection of light against underlying layers during photolithography process. The hard mask film 210 and the first sacrificial layer 220, and the anti-reflection layer may be for by the process such as atomic layer deposition (ALD), chemical vapor deposition (CVD) or spin coating, possibly added with baking or curing depending on materials used.

The rough pattern RP may be formed on the first sacrificial layer 220. The rough pattern RP may extend in the first direction Y. There may be a plurality of rough patterns RP, which may be spaced apart from each other in a second direction X, Compared to a first smooth pattern SP1 and a second smooth pattern SP2 which will be described below, the rough pattern RP may have a relatively greater line edge roughness LER. That is, edges may be relatively more jagged The rough pattern RP may include a photo resist (PR). The rough pattern RP may be formed by exposing a mask film and then patterning the same. At this time, the light source for use in exposure may be a krypton fluoride (ktF) laser, an argon fluoride (ArF) laser, or an extreme ultra violet (EUV) laser. At this time, the argon fluoride laser may expose finer pattern than the krypton fluoride laser, and the extreme ultra violet laser may expose the finest pattern.

Accordingly, when exposed to an argon fluoride laser and an extreme ultra violet, the patterns may have finer intervals and widths. Given this, the light edge roughness can be considered relatively more important than in the case of exposure with the krypton fluoride laser. That is, the high line edge roughness among the finer patterns may increase a risk of short among the patterns, which will increase need for an enhancement process thereof.

The rough pattern RP may additionally include an amorphous carbon layer (ACL). At this time, the rough pattern RP may be formed by the chemical vapor deposition (CVD) and then patterned by partial etching. In the above example, again, it is necessary to enhance the LER of the rough pattern RP. Accordingly, the rough pattern RP may be changed into a first smooth pattern SP1 and a second smooth pattern SP2 in the subsequent processes.

Figure 3:
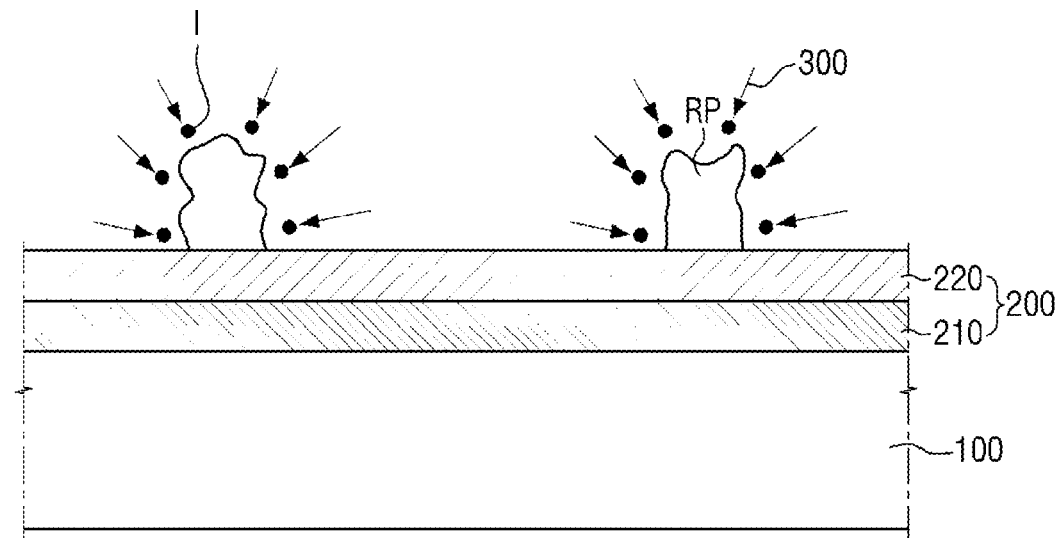
Figure 4:
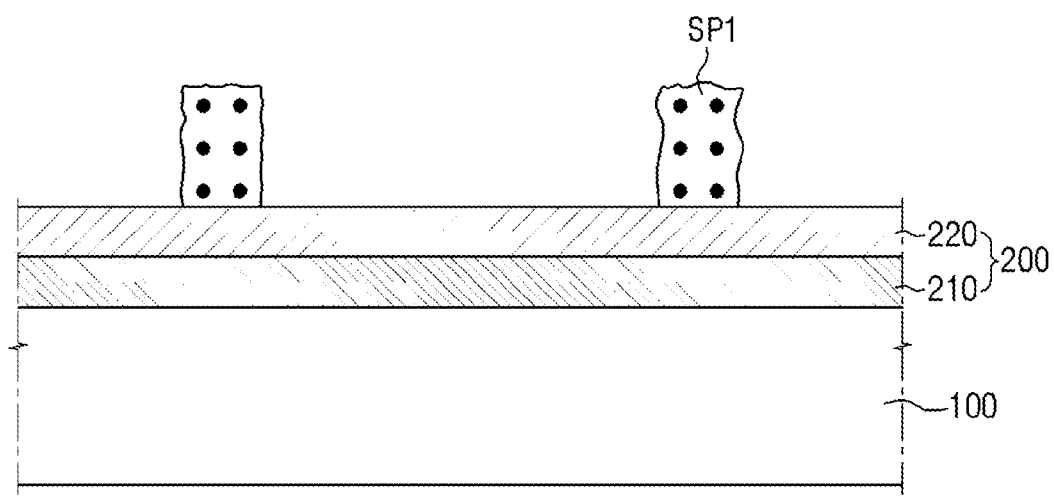

Referring to FIGS. 3 and 4, the rough pattern RP may be subject to ion implantation 300. The ion implantation 300 may involve a method of introducing ions e rough pattern RP to thus enhance the line edge roughness of the rough pattern RP.

At this time, the ions (I) for the ion implantation 300 may be at least one substance of C, Ar, $H_2$ and $O_2$. For example, the ions (I) may be carbon (C) ions.

The rough pattern RP may become the first smooth pattern SP1 by the ion implantation 300. Compared to the rough pattern RP, the first smooth pattern SP1 may have enhanced LER. The first smooth pattern SP1 may be in such a condition that ions (I) are introduced therewithin by the ion implantation 300.

Figure 5:
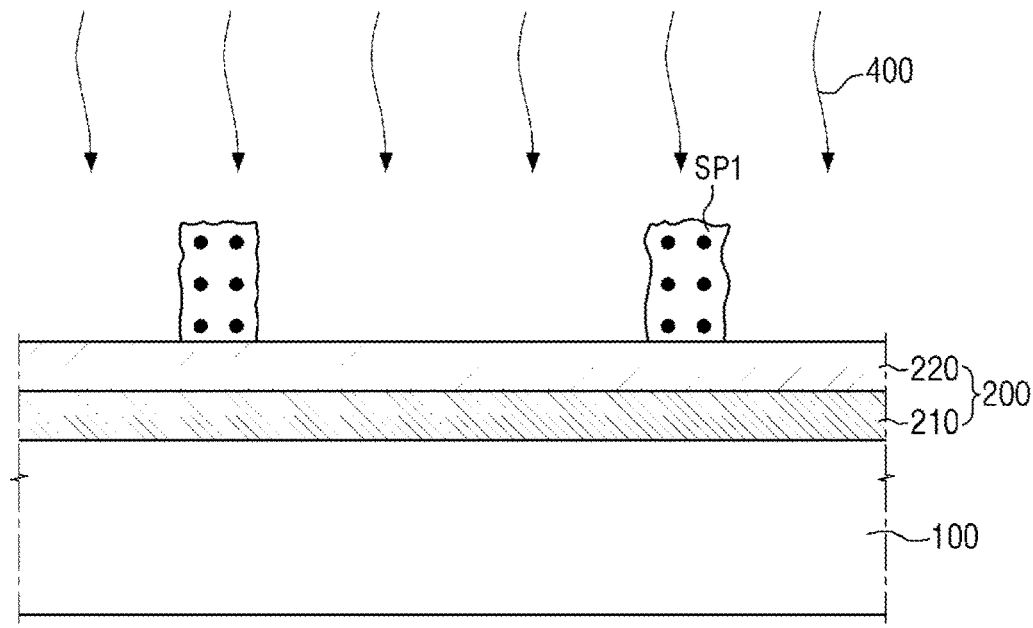

Referring to FIG. 5, the first smooth pattern SP1 may be subject to plasma treatment 400. The plasma treatment 400 may be performed in-situ of the ion implantation 300. However, example embodiments are not limited thereto. Accordingly, the plasma treatment 400 may be performed ex-situ of the ion implantation 300.

The plasma treatment 400 may use HBr or He plasma. However, example embodiments are not limited to the example given above. The first smooth pattern SP1 may have further enhanced LER due to the plasma treatment 400. That is, the first smooth pattern SP1 may have more even edges by the plasma treatment.

Figure 6:
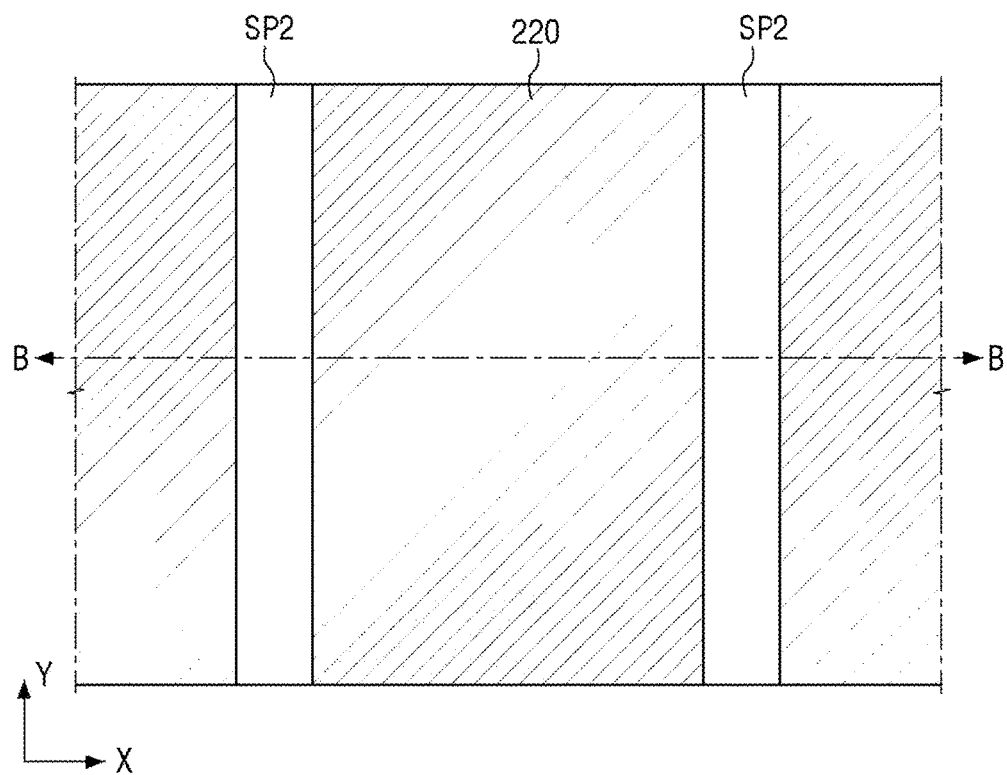
Figure 7:
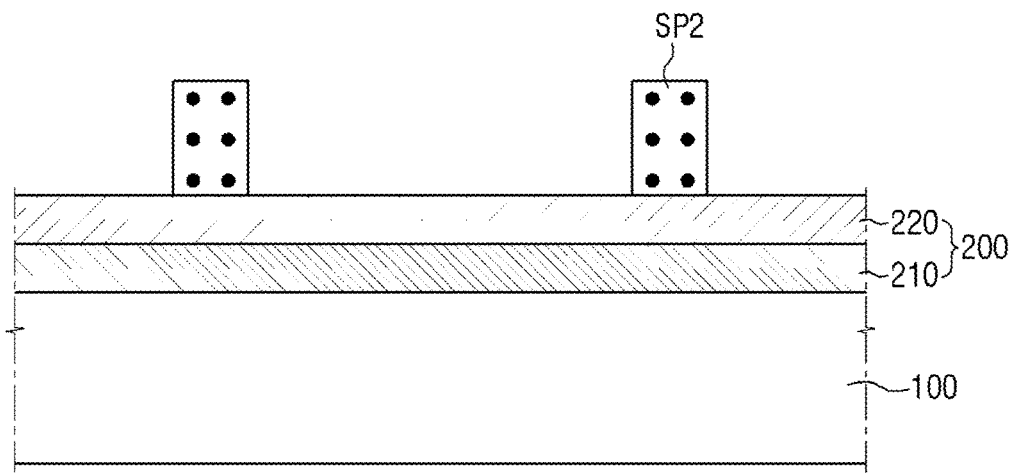

Referring to FIGS. 6 and 7, the first smooth pattern SP1 may become the second smooth pattern SP2 by the plasma treatment 400. The second smooth pattern SP2 may have relatively enhanced LER than the first smooth pattern SP1. That is, the second smooth pattern SP2 may have relatively smoother edges than those of the first smooth pattern SP1.

As a result, the rough pattern RP may become the second smooth pattern SP2 of enhanced LER, by the ion implantation 300 and the plasma treatment 400. The second smooth pattern SP2 may be the pattern of enhanced LER which is greater than the LER of the rough pattern RP as well as the first smooth pattern SP1. The LER of the second smooth pattern SP2 may influence the LERs of the patterns to be formed, considering that it may be used as a mask for the double patterning technology (DPT) or quadruple patter technology (QPT) which will follow. That is, when the LER of the second smooth pattern SP2 is enhanced, the LERs of the to-be-formed patterns can be automatically enhanced. It is possible to enhance reliability and performance of the semiconductor device by enhancing the LER of the second smooth pattern SP2, especially in a process that forms micro patterns with the double patterning technology or quadruple patterning technology.

Figure 8:
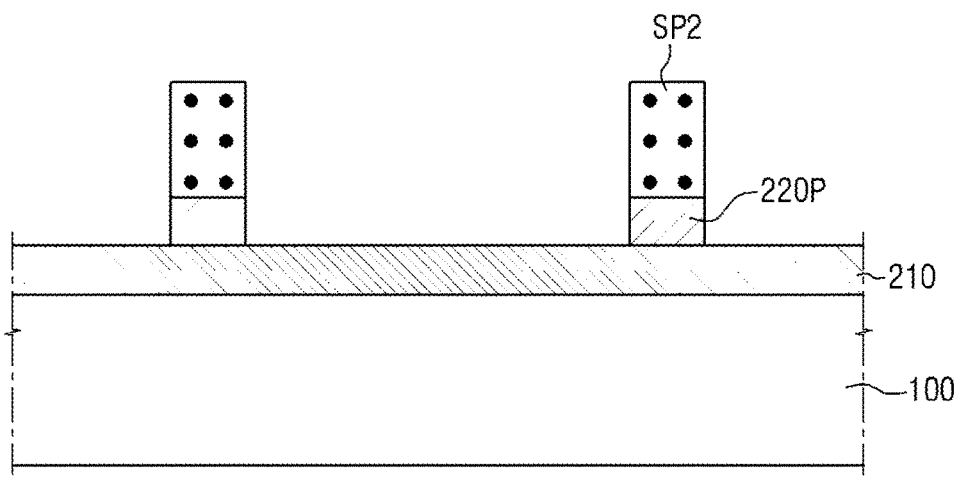

Referring to FIG. 8, the first sacrificial layer 220 may be patterned with the second smooth pattern SP2 as a mask. The first sacrificial layer 220 may be patterned with the second smooth pattern SP2 as a mask, by anisotropic etching. The first sacrificial layer 220 may be patterned into a first sacrificial pattern 220P. The first sacrificial pattern 220P may be transferred by the second smooth pattern SP2 so that it is formed with similar LER. That is, the more the LER of the second smooth pattern SP2 is enhanced, the more the LER of the first sacrificial pattern 220P may be enhanced.

Figure 9:
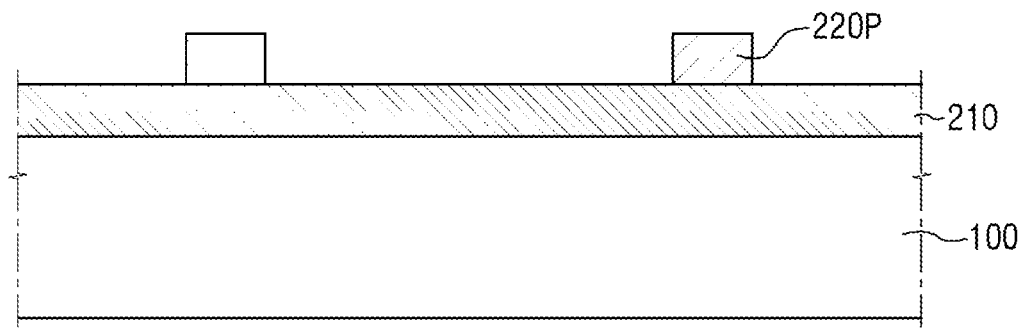

Referring to FIG. 9, the second smooth pattern SP2 may be removed. The second smooth pattern SP2 may be removed by ashing or etching. However, example embodiments are not limited to the example given above. The removal of the second smooth pattern SP2 may allow the upper surface of the first sacrificial pattern 220P to be exposed.

Figure 10:
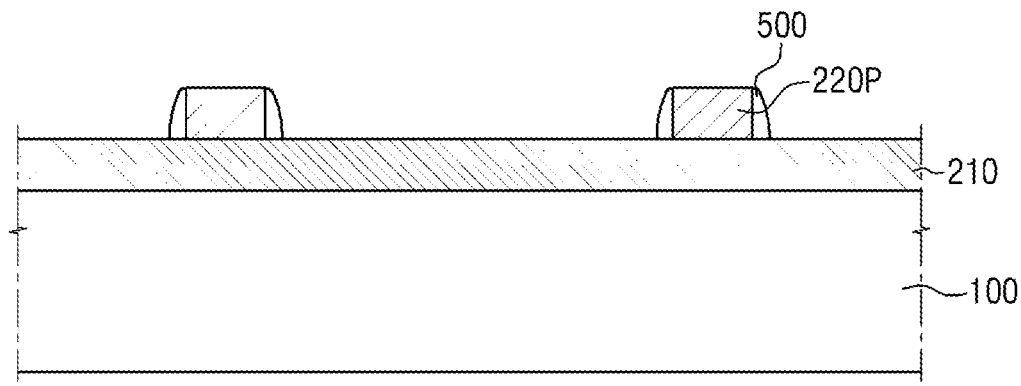

Referring to FIG. 10, a first spacer 500 may be formed on a sidewall of the first sacrificial pattern 220P. The material for the first spacer 500 may include a material with an etch selectivity to the first sacrificial pattern 220P. For example, when the first sacrificial pattern 220P is formed of any one of polycrystalline silicon, amorphous carbon layer (ACL) and spin-on hardmask (SOH), the material for the first spacer 500 may be formed of silicon oxide or silicon nitride. The first spacer 500 may be formed by patterning the film formed by the atomic layer deposition (ALD). However, example embodiments are not limited to the example given above.

The LER of the first spacer 500 may be influenced by the LER of the first sacrificial pattern 220P. Accordingly, the more the LER of the first sacrificial pattern 220P is enhanced, the more the LER of the first spacer 500 can be enhanced.

Although not illustrated, trimming process may be added to adjust width of the first spacer 500. The width of the first spacer 500 can determine the width of fin-type patterns F1, F2 to be formed later. The trimming process may be performed by wet etching. The etchant may be HF-based, although not limited thereto.

Figure 11:
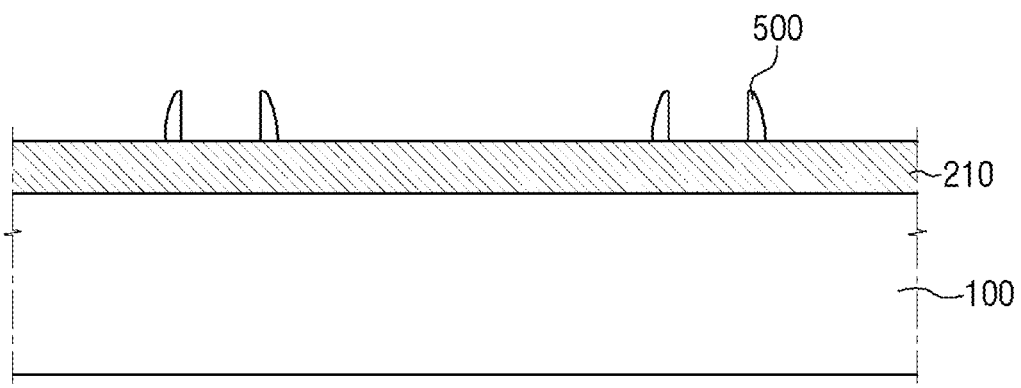

Referring to FIG. 11, the first sacrificial pattern 220P may be removed. As described above, the first sacrificial pattern 220P has an etch selectivity to the first spacer 500. Accordingly, selective removal may be performed so that the first spacer 500 is not removed. With the removal of the first sacrificial pattern 220P, the first spacer 500 may have the interval corresponding to the width of the first sacrificial pattern 220P in the second direction X.

Figure 12:
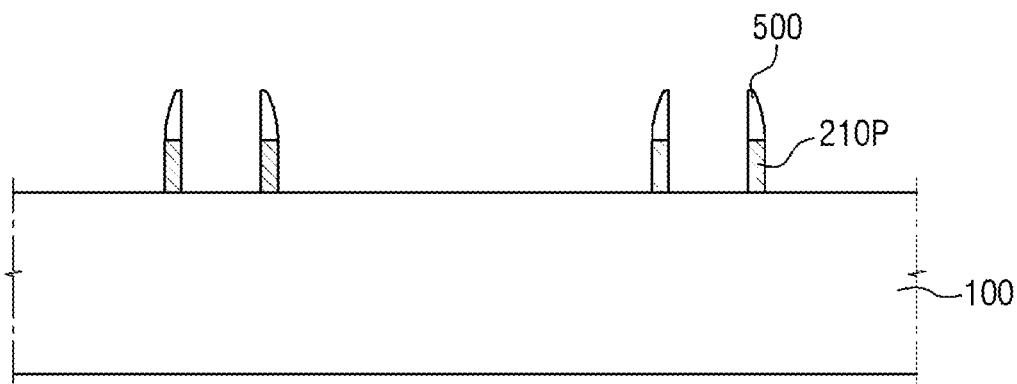

Referring to FIG. 12, the hard mask film 210 may be patterned with the first spacer 500 as a mask. That is, the hard mask film 210 may be selectively removed, leaving only the area overlapped with the first spacer 500. As a result, the hard mask film 210 may be patterned into a hard mask pattern 210P in a bar-shaped pattern. The hard mask pattern 210P may be positioned at a same or similar interval as the first spacer 500.

The LER of the hard mask pattern 210P may be influenced by the LER of the first spacer 500. Accordingly, the more the LER, of the first spacer 500 is enhanced, the more the LER of the hard mask pattern 210P can be enhanced.

Figure 13:
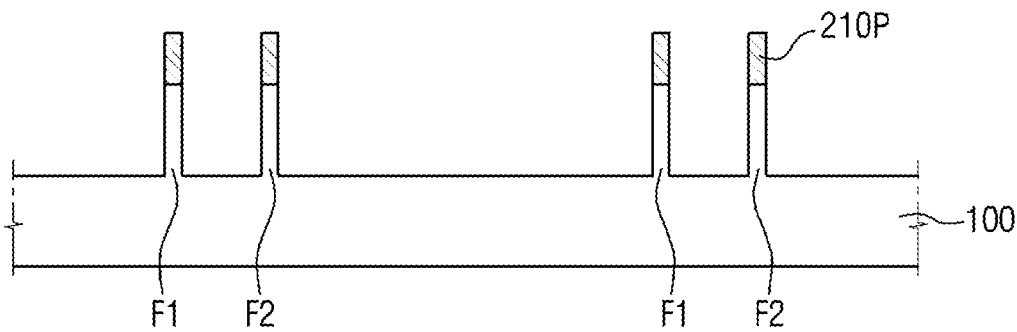

Referring to FIG. 13, the first spacer 500 is removed, and the substrate 100 is patterned with the hard mask pattern 210P as a mask so that fin-type patterns F1, F2 are formed.

The fin-type patterns F1, F2 may include a first fin-type pattern F1 and a second fin-type pattern F2. The first fin-type pattern F1 and the second fin-type pattern F2 may respectively correspond to the two first spacers 500 formed on both sidewalls of the first sacrificial pattern 220P. The interval in the second direction X between the first fin-type pattern F1 and the second fin-type pattern F2 may be same as the width of the first sacrificial pattern 220P in the second direction X. The expression "same" as used herein is the concept that encompasses presence of minute stepped portions.

The LER of the fin-type patterns F1, F2 may be influenced by the LER of the hard mask pattern 210P. Accordingly, the more the LER of the hard mask pattern 210P is enhanced, the more the LER of the fin-type patterns F1, F2 can be enhanced. That is, as the LER, of the rough pattern RP is enhanced to the LER of the second smooth pattern SP2, it can be enhanced to the LER of the fin-type patterns F1, F2. In the case of micro pattern forming process such as DPT process, enhanced LER of the fin-type patterns F1, F2 can result in a reduced risk of short between the fin-type patterns F1 F2. As a result, the reliability of the semiconductor device can be enhanced significantly.

Figure 14:
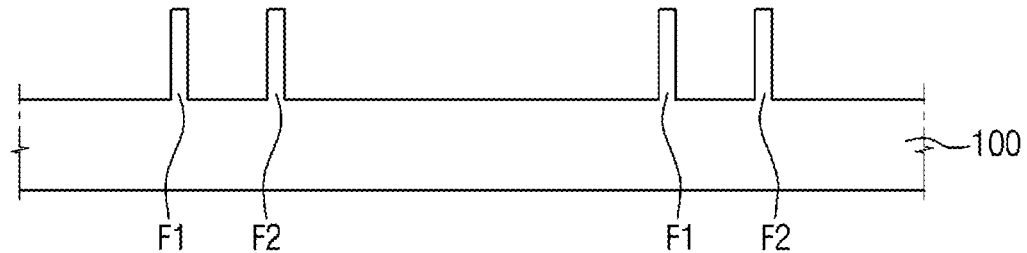

Referring to FIG. 14, the hard mask pattern 210P may be removed. The removal of the hard mask pattern 210P may allow the upper surfaces of the fin-type patterns F1, F2 to be exposed.

The fin cut process may be added after forming of the fin-type patterns F1, F2 to partially remove the fin-type patterns F1, F2. Next, an interlayer insulating film may be so formed as to partially cover the fin-type patterns F1, F2, and a gate electrode may be formed on the fin-type patterns F1, F2 in the second direction X. A transistor may then be formed by forming source/drain on both sides of the gate electrode in the first direction Y.

As described above, in certain example embodiments, the LER of the rough patter RP may be enhanced to thus enhance LERs of the patterns to be formed later. The enhanced LER can ensure reliability of the semiconductor device which is formed in micro patterns.

Herein below, a method for fabricating a semiconductor device according to some example embodiments will be explained with reference to FIGS. 1, 2, 8 to 14, and 15 to 17. In the following description, description overlapped with the exemplary embodiments already provided above will not be described or described as brief as possible for the sake of brevity.

Figure 15:
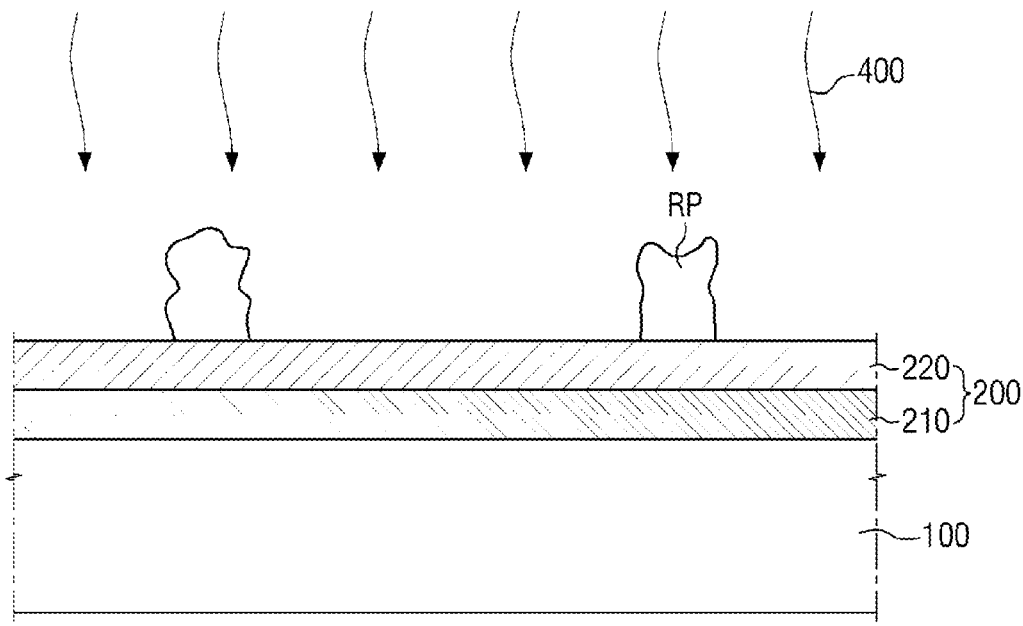
Figure 16:
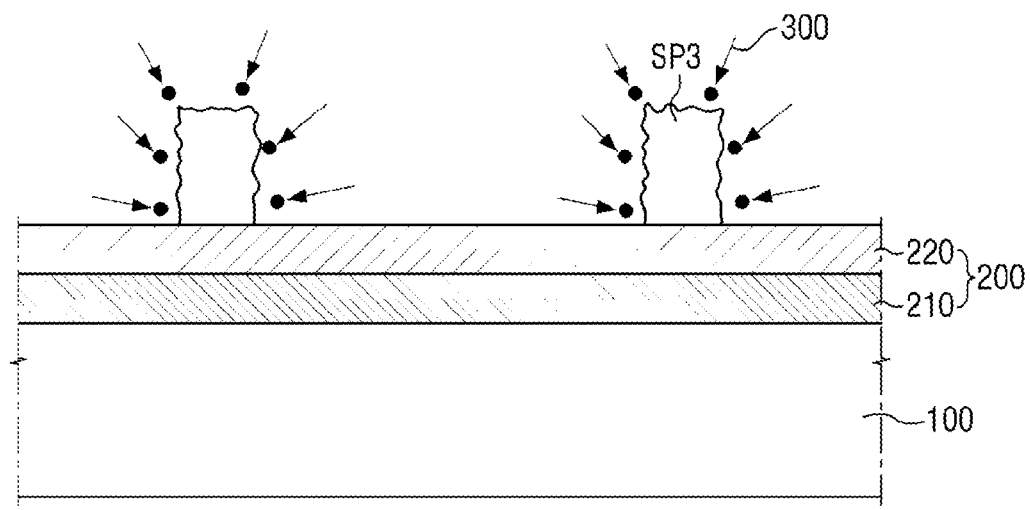
Figure 17:
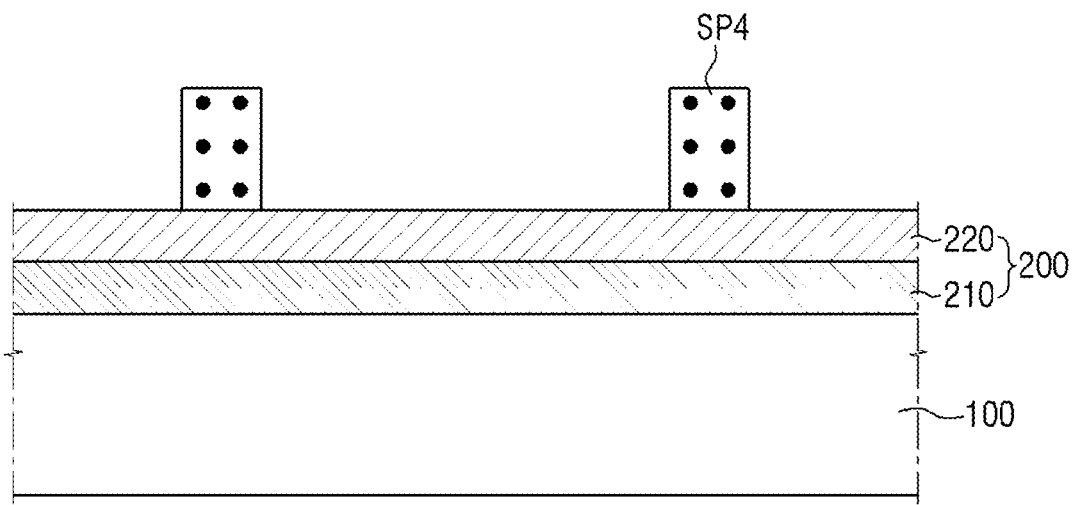
Figure 18:
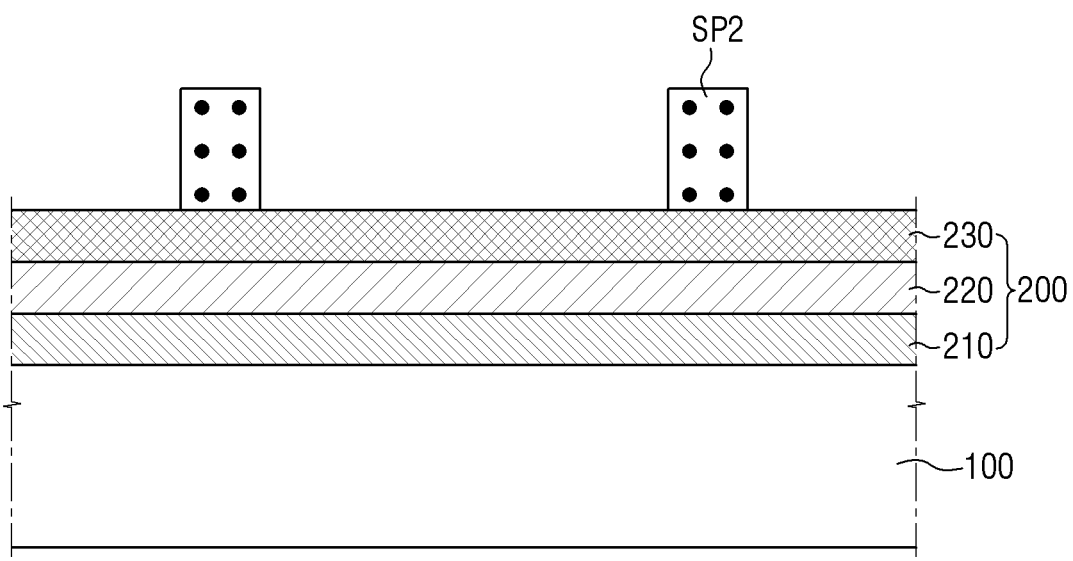

FIGS. 15 to 17 are views illustrating intermediate stages of fabrication, provided to explain a method for fabricating a semiconductor device according to some example embodiments.

Example embodiments will be described with reference to FIG. 15, while the example embodiments described above with reference to FIGS. 1 and 2 will not be described in detail for the sake of brevity. According to example embodiments described above, ion implantation may be first performed, followed by the plasma treatment, although the sequence of the treatments may vary depending on embodiments.

That is, referring to FIG. 15, the plasma treatment 400 may be performed on the rough pattern RP before the ion implantation 300.

The plasma treatment 400 may use HBr or He plasma. However, example embodiments are not limited to the example given above. That is, the rough pattern RP may have further enhanced LER by the plasma treatment 400. That is, the rough pattern RP may have more even edges by the plasma treatment. The rough pattern RP may become a third smooth pattern SP3 by the plasma treatment 400, Referring to FIGS. 16 and 17, after the third smooth pattern SP3 is formed by the plasma treatment 400, the ion implantation 300 may be performed on the third smooth pattern SP3.

The ion implantation 300 may involve a method of introducing ions (I) into the third smooth pattern SP3 to thus enhance the LER of the third smooth pattern SP3.

At this time, the ions (I) for the ion implantation 300 may be at least one substance of C, Ar, $H_2$ and $O_2$. For example, the ions (I) may be carbon (C) ions.

The rough pattern RP may become a fourth smooth pattern SP4 by the ion implantation 300. Compared to the third smooth pattern SP3, the fourth smooth pattern SP4 may have relatively enhanced LER. The fourth smooth pattern SP4 may be in such a condition that ions (I) are introduced therewithin by the ion implantation 300.

The ion implantation 300 may be performed in-situ of the plasma treatment 400. However, example embodiments are not limited thereto. Accordingly, the ion implantation 300 may be performed ex-situ of the plasma treatment 400.

Next, the fin-type patterns F1, F2 may be formed as illustrated in FIGS. 8 to 14. This will not be redundantly described as the same has already been described above.

Herein below, a method for fabricating a semiconductor device according to some example embodiments will be explained with reference to FIGS. 1 to 7, and 18 to 26. In the following description, description overlapped with the example embodiments already provided above will not be described or described as brief as possible for the sake of brevity.

FIGS. 18 to 26 are views illustrating intermediate stages of fabrication, provided to explain a method for fabricating a semiconductor device according to some example embodiments.

Referring to FIGS. 1 to 7 and 18, compared to the example embodiments described above, the composite film 200 may additionally include a second sacrificial layer 230. The rough pattern RP may become the second smooth pattern SP2 of enhanced LER, by the ion implantation 300 and the plasma treatment 400.

The second sacrificial layer 230 may include any one of polycrystalline silicon, ACL and SOH. Although not illustrated, anti-reflection layers may be formed between the first sacrificial layer 220 and the second sacrificial layer 230, and between the second sacrificial layer 230 and the rough pattern RP. The anti-reflection layer may be formed of silicon oxynitride film (SiON). The anti-reflection layers are the layers provided to prevent reflection of light against underlying layers during photolithography process. The second sacrificial layer 230 and the anti-reflection layer may be formed by the process such as atomic layer deposition (ALD), chemical vapor deposition (CVD) or spin coating, possibly added with baking or curing depending on materials used.

Figure 19:
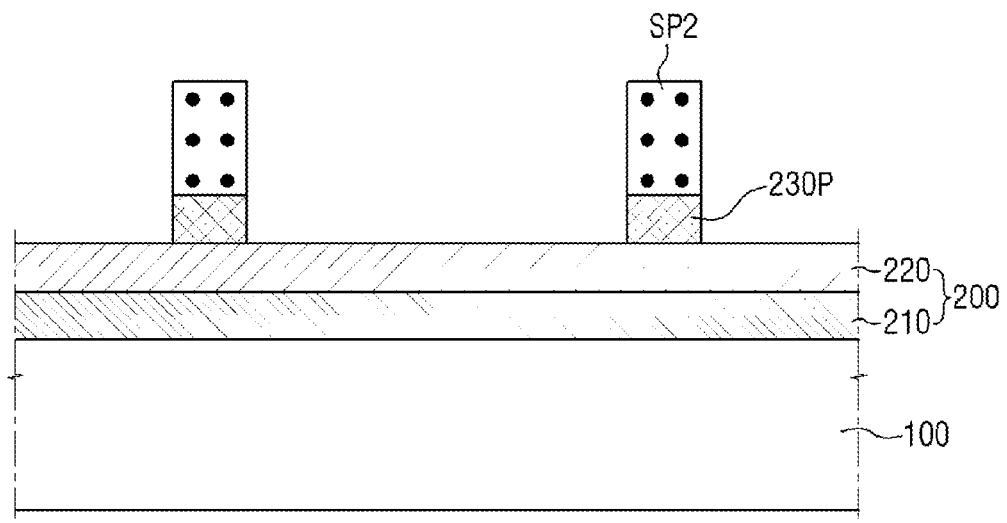

Referring to FIG. 19, the second sacrificial layer 230 may be patterned with the second smooth pattern SP2 as a mask. The second sacrificial layer 230 may be patterned with the second smooth pattern SP2 as a mask, by anisotropic etching. The second sacrificial layer 230 may be patterned into the second sacrificial pattern 230P. The second sacrificial pattern 230P may be transferred by the second smooth pattern SP2 so that it is formed with similar LER. That is, the more the LER of the second smooth pattern SP2 is enhanced, the more the LER of the second sacrificial pattern 230P can be enhanced.

Figure 20:
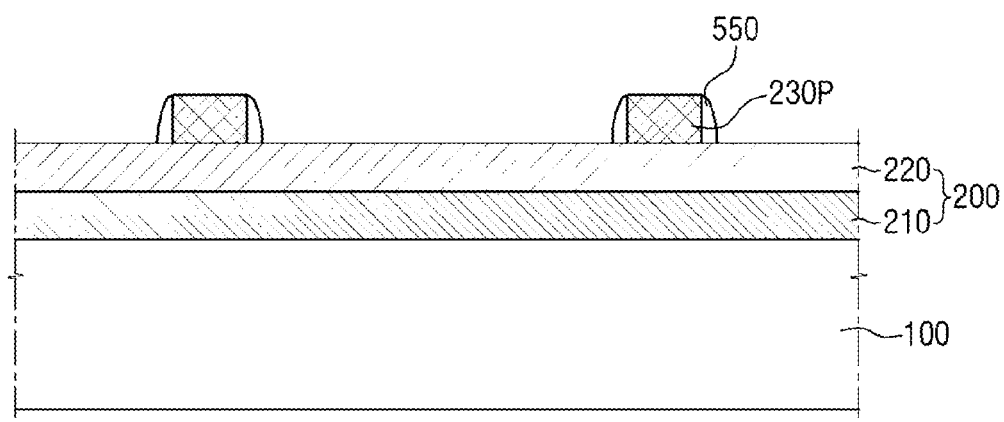

Referring to FIG. 20, the second smooth pattern SP2 may be removed. The second smooth pattern SP2 may be removed by ashing or etching. However, example embodiments are not limited to the example given above. The removal of the second smooth pattern SP2 may allow the upper surface of the second sacrificial pattern 230P to be exposed.

A second spacer 550 may then be formed on a sidewall of the second sacrificial pattern 230P. The material for the second spacer 550 may include a material with an etch selectivity to the second sacrificial pattern 230P. For example, when the second sacrificial pattern 230P is formed of any one of polycrystalline silicon, amorphous carbon layer (ACL) and spin-on hardmask (SOH), the material for the second spacer 550 may be formed of silicon oxide or silicon nitride. The second spacer 550 may be formed by patterning the film formed by the atomic layer deposition (ALD). However, example embodiments are not limited to the example given above.

The LER of the second spacer 550 may be influenced by the LER of the second sacrificial pattern 230P. Accordingly, as the LER of the second sacrificial pattern 230P is enhanced, the LER of the second spacer 550 can be enhanced.

Although not illustrated, trimming process may be added to adjust width of the second spacer 550. The width of the second spacer 550 can determine the interval of the fin-type patterns F1, F2 to be formed later. The trimming process may be performed by wet etching. At this time, the etchant may be HF-based, although example embodiments are not limited thereto.

Figure 21:
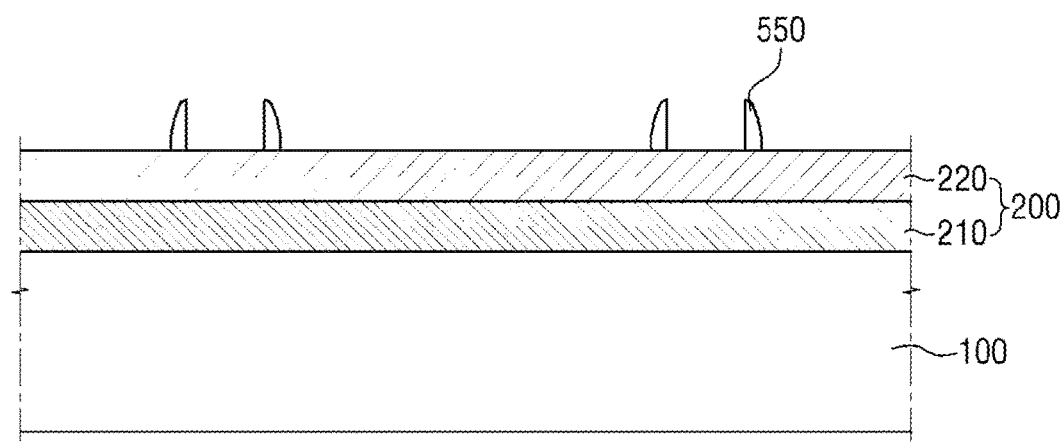

Referring to FIG. 21, the second sacrificial pattern 230P may be removed. As described above, the second sacrificial pattern 230P has an etch selectivity to the second spacer 550. Accordingly, selective removal may be performed so that the second spacer 550 is not removed. With the removal of the second sacrificial pattern 230P, the second spacer 550 may have the interval corresponding to the width of the second sacrificial pattern 230P in the second direction X.

Figure 22:
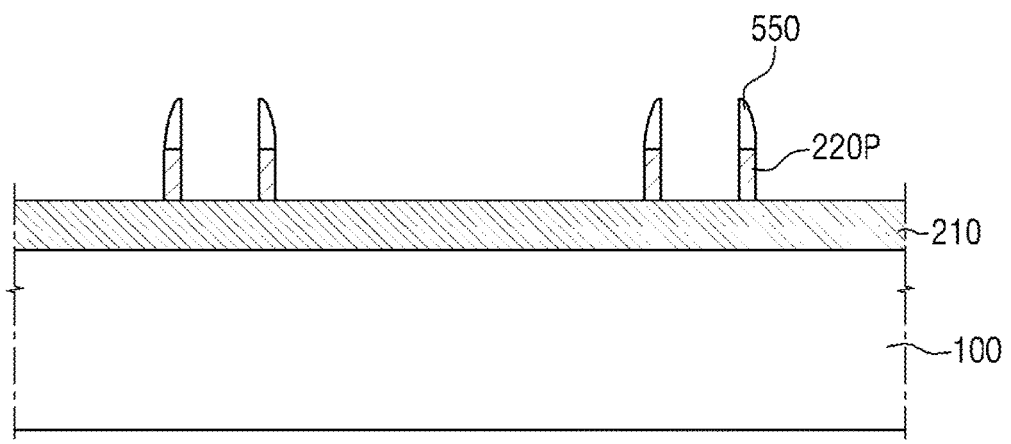

Referring to FIG. 22, the first sacrificial layer 220 may be patterned with the second spacer 550 as a mask. That is, the first sacrificial layer 220 may be selectively removed, leaving only the area overlapped with the second spacer 550. As a result, the first sacrificial layer 220 may be patterned into a first sacrificial pattern 220P which is a bar-shaped pattern. The first sacrificial pattern 220P may be positioned at a same or similar interval as the second spacer 550.

The LER of the first sacrificial pattern 220P may be influenced by the LER of the second spacer 550. Accordingly, the more the of the second spacer 550 is enhanced, the more the LER of the first sacrificial pattern 220P can be enhanced.

Figure 23:
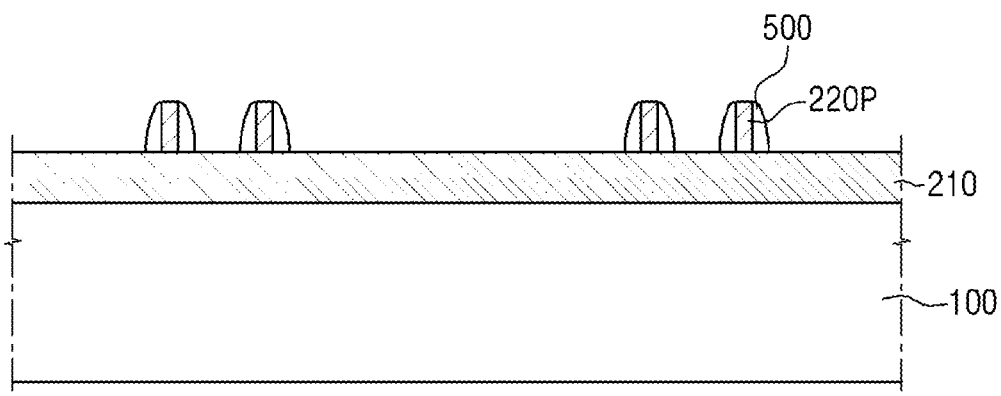
Figure 24:
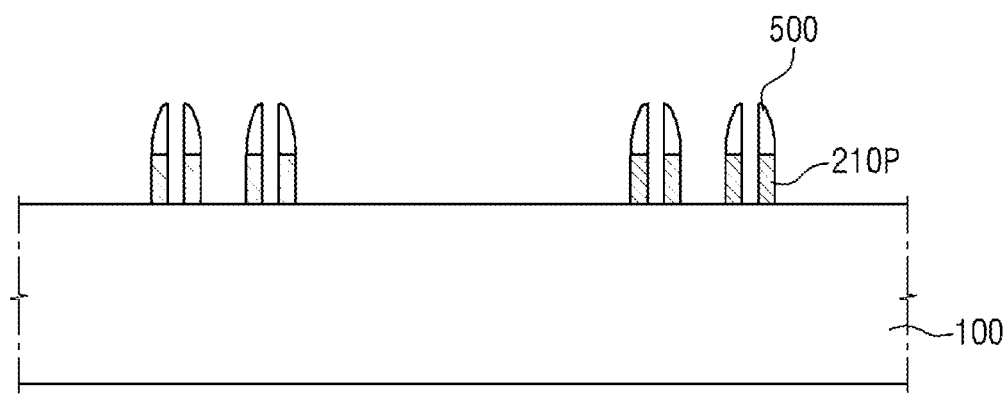

Referring to FIG. 23, the second spacer 550 may be removed, and the first spacer 500 may be formed on a sidewall of the first sacrificial pattern 220P. The material for the first spacer 500 may include a material with an etch selectivity the first sacrificial pattern 220P. The first spacer 500 may be formed by patterning the film formed by the atomic layer deposition (ALD). However, example embodiments are not limited to the example given above.

The LER of the first spacer 500 may be influenced by the LER of the first sacrificial pattern 220P. Accordingly, the more the LER of the first sacrificial pattern 220P is enhanced, the more the LER of the first spacer 500 can be enhanced.

Although not illustrated, trimming process may be added to adjust width of the first spacer 500. The width of the first spacer 500 can determine the width of fin-type patterns F1, F2 to be formed later. The trimming process may be performed by wet etching. At this time, the etchant may be HF-based, although example embodiments are not limited thereto, Referring to FIG. 24, the first sacrificial pattern 220P may be removed. As described above, the first sacrificial pattern 20P has an etch selectivity to the first spacer 500. Accordingly, a selective removal may be performed so that the first spacer 500 is not removed. With the removal of the first sacrificial pattern 220P, the first spacer 500 may have the interval corresponding to the width of the first sacrificial pattern 220P in the second direction X.

Next, the hard mask film 210 may be patterned with the first spacer 500 as a mask. That is, the hard mask film 210 may be selectively removed, leaving only the area overlapped with the first spacer 500. As a result, the hard mask film 210 may be patterned into a hard mask pattern 210P in a bar-shaped pattern. The hard mask pattern 210P may be positioned at a same or similar interval as the first spacer 500.

The LER of the hard mask pattern 210P may be influenced by the LER of the first spacer 500. Accordingly, the more the LER of the first spacer 500 is enhanced, the more the LER of the hard mask pattern 210P can be enhanced.

Figure 25:
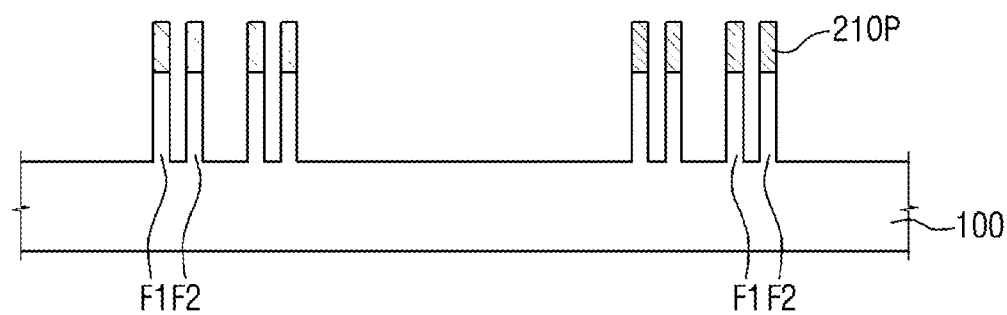
Figure 26:
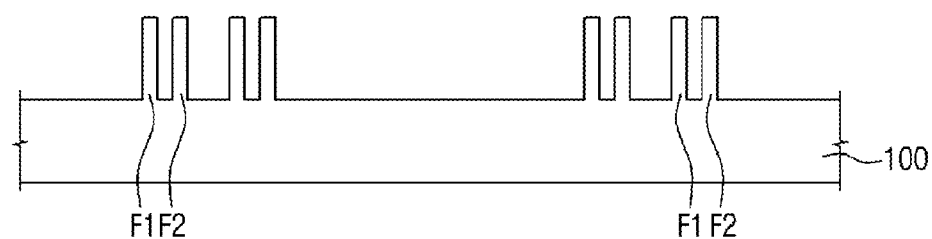

Referring to FIG. 25, the first spacer 500 may be removed, and the substrate 100 may be patterned with the hard mask pattern 210P as a mask so that fin-type patterns F1, F2 are formed.

The fin-type patterns F1, F2 may include a first fin-type pattern F1 and a second fin-type pattern F2. The first fin-type pattern F1 and the second fin-type pattern F2 may respectively correspond to the two first spacers 500 formed on both sidewalls of the first sacrificial pattern 220P. The interval in the second direction X between the first fin-type pattern F1 and the second fin-type pattern F2 may be same as the width of the first sacrificial pattern 220P in the second direction X. The expression "same" as used herein is the concept that encompasses presence of minute stepped portions.

The LER of the fin-type patterns F1, F2 may be influenced by the LER, of the hard mask pattern 210P. Accordingly, the more the LER of the hard mask pattern 210P is enhanced, the more the LER of the fin-type patterns F1, F2 can be enhanced. That is, as the LER, of the rough pattern RP is enhanced to the LER of the second smooth pattern SP2, it can be enhanced to the LER of the fin-type patterns F1, F2. In the case of micro pattern forming process such as QPT process, enhanced LER of the fin-type patterns F1, F2 can result in a reduced risk of short between the fin-type patterns F1, F2. As a result, the reliability of the semiconductor device can be enhanced significantly, Referring to FIG. 26, the hard mask pattern 210P may be removed. The removal of the hard mask pattern 210P may allow the upper surfaces of the fin-type patterns F1, F2 to be exposed.

The fin cut process may be added after forming of the fin-type patterns F1, F2 to partially remove the fin-type patterns F1, F2. Next, an interlayer insulating film may be so formed as to partially cover the fin-type patterns F1, F2, and a gate electrode may be formed on the fin-type patterns F1, F2 in the second direction X. A transistor may then be formed by forming source/drain on both sides of the gate electrode in the first direction Y.

As described above, in certain example embodiments, the LER of the rough pattern RP may be enhanced to thus enhance LERs of the patterns to be formed later. The enhanced LER, can ensure reliability of the semiconductor device formed in micro patterns.

Herein below, a method for fabricating a semiconductor device according to some example embodiments will be explained with reference to FIGS. 27 to 39. In the following description, description overlapped with the example embodiments already provided above will not be described or described as brief as possible for the sake of brevity.

FIGS. 27 to 39 are views illustrating intermediate stages of fabrication, provided to explain a method for fabricating a semiconductor device according to some example embodiments.

Figure 27:
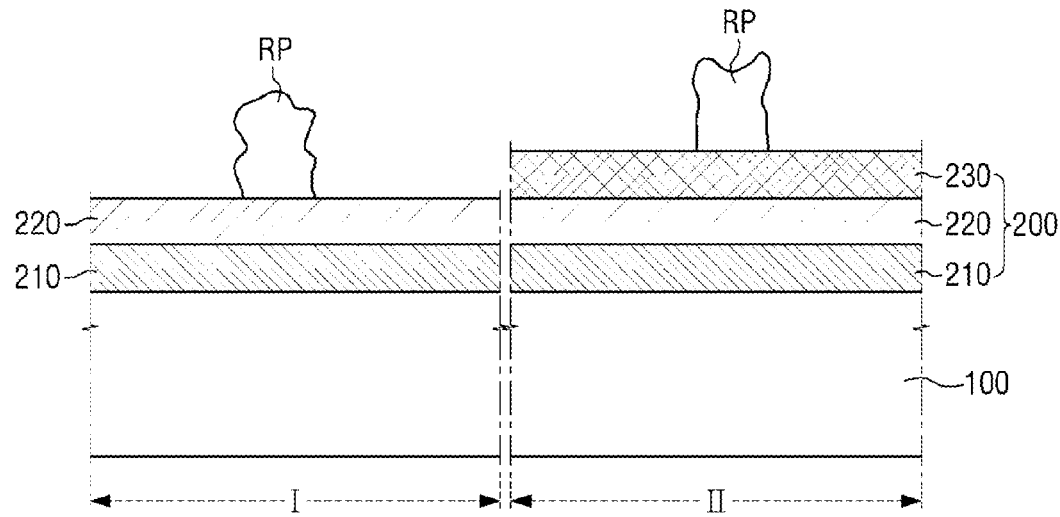

Referring to FIG. 27, the substrate 100 may include a first region I and a second region II. The first region I and the second region II may be the regions adjacent to each other or spaced apart from each other. In the first region I, the composite film 200 on the substrate 100 may include the hard mask film 210 and the first sacrificial layer 220. In the second region II, the composite film 200 on the substrate 100 may include the hard mask film 210, the first sacrificial layer 220 and the second sacrificial layer 230.

In the first region I, the rough pattern RP may be formed on the first sacrificial layer 220, and in the second region II, the rough pattern RP may be formed on the second sacrificial layer 230.

Although not illustrated in the drawings, anti-reflection layers may be formed between the hard mask film 210 and the first sacrificial layer 220, between the first sacrificial layer 220 and the rough pattern RP, and between the second sacrificial layer 230 and the rough pattern RP. The anti-reflection layer may be formed of silicon oxynitride film (SiON). The anti-reflection layers are the layers provided to prevent reflection of light against underlying layers during photolithography process. The hard mask film 210, the first sacrificial layer 220, the second sacrificial layer 230, and the anti-reflection layer may be formed by the process such as atomic layer deposition (ALD), chemical vapor deposition (CVD) or spin coating, possibly added with baking or curing depending on materials used.

Figure 28:
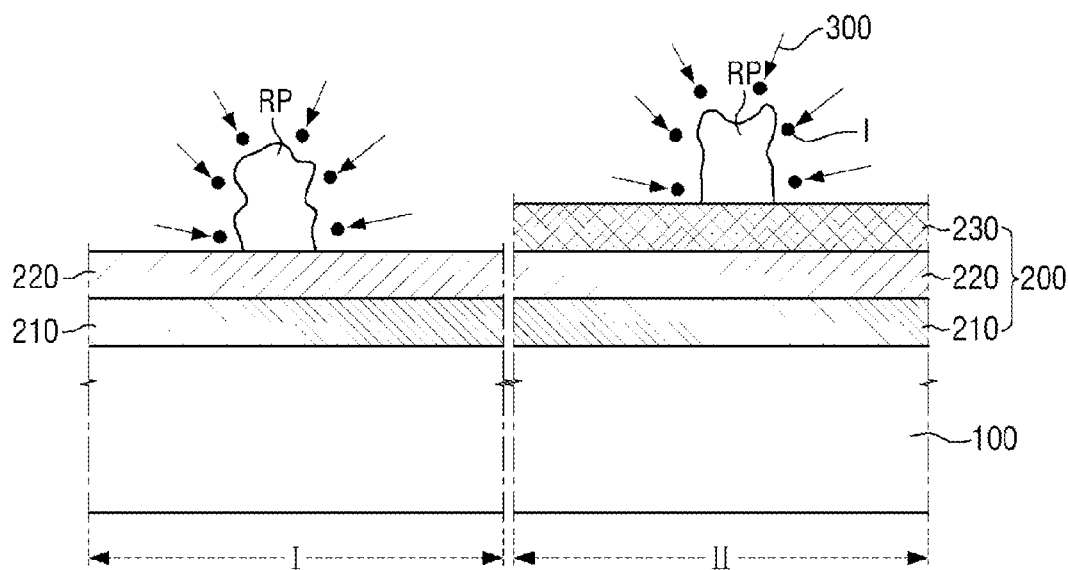
Figure 29:
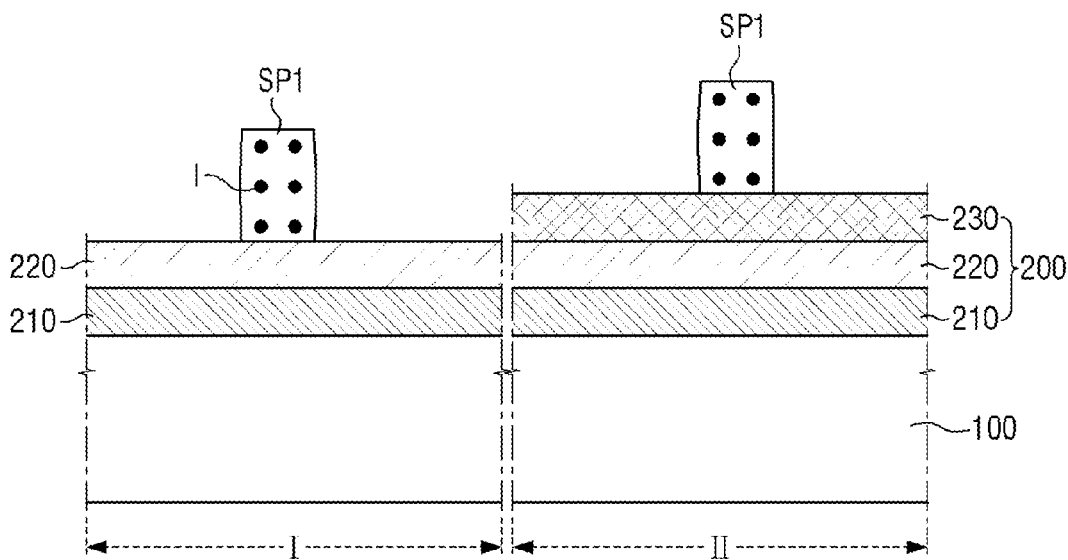

Referring to FIGS. 28 and 29, the rough pattern RP in the first region I and the second region II may be subject to ion implantation 300. The ion implantation 300 may involve a method of introducing ions (I) into the rough pattern RP to thus enhance the line edge roughness of the rough pattern RP.

At this time, the ions (I) for the ion implantation 300 may be at least one substance of C, Ar, $H_2$ and $O_2$. For example, the ions (I) may be carbon (C) ions.

The rough pattern RP may become the first smooth pattern SP1 by the ion implantation 300. Compared to the rough pattern RP, the first smooth pattern SP1 may have relatively enhanced LER. The first smooth pattern SP1 may be in such a condition that ions (I) are introduced therewithin by the ion implantation 300.

Figure 30:
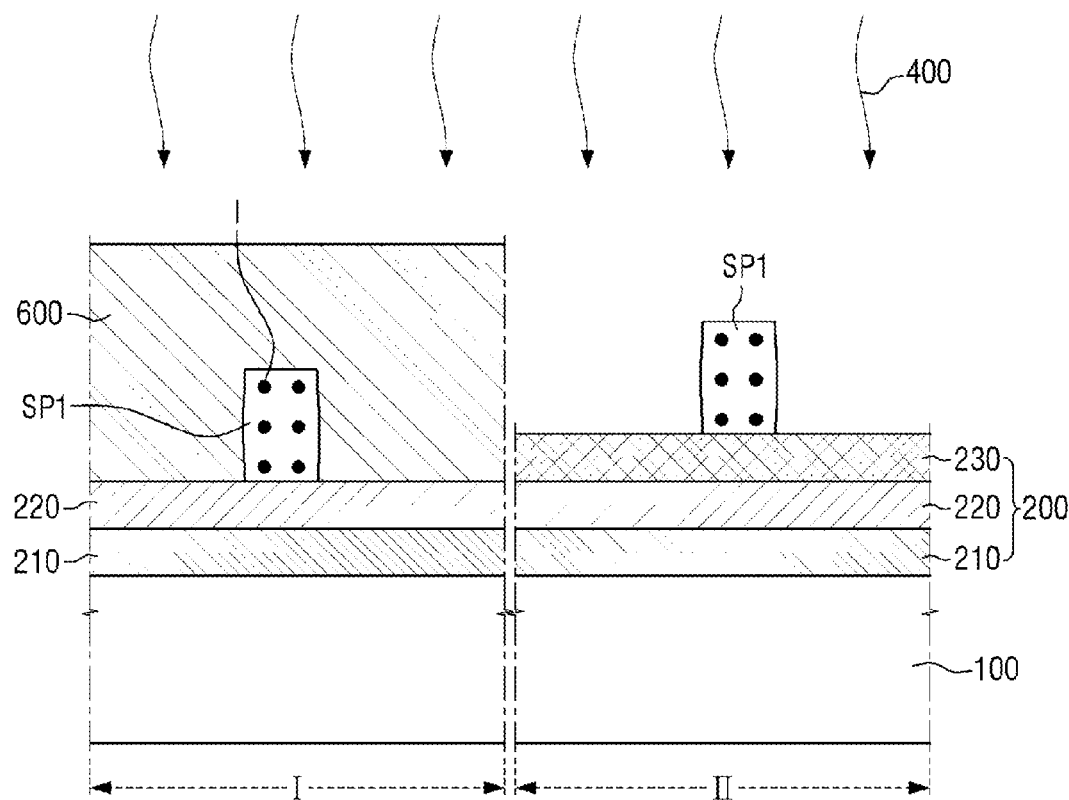

Referring to FIG. 30, a shielding film 600 may be formed in the first region I. The shielding film 600 may not be formed in the second region II. The shielding film 600 may protect the first region I from the plasma treatment 400.

The first region I may later form the fin-type patterns F1, F2 by the DPT, and the second region II may later form the fin-type patterns F1, F2 by the QPT. Accordingly, the second region II may form finer patterns compared to the first region I. As the patterns become finer, the LERs of the patterns may have further increased correlatively with the reliability of the semiconductor device. That is, for the finer patterns, it is more necessary that the LER is enhanced to ensure the reliability of the semiconductor device.

On the contrary, the plasma treatment 400 may generate defects in the portions other than the patterns for enhancing LER, and may influence the etch rate in the following etching process, which can possibly compromise the uniformity in the fabricating process. Accordingly, the ways to achieve durability and uniformity of the device can be contemplated, by minimizing the use of plasma treatment 400 for the fine pattern regions, and skipping the plasma treatment 400 for the rest regions.

Accordingly, in the second region II where the QPT process is applied, the first smooth pattern SP1 may be changed into the second smooth pattern SP2 by the plasma treatment 400, while in the first region I where the DPT process is applied, the shielding film 600 may be used to prevent the plasma treatment 400 from progressing.

Figure 31:
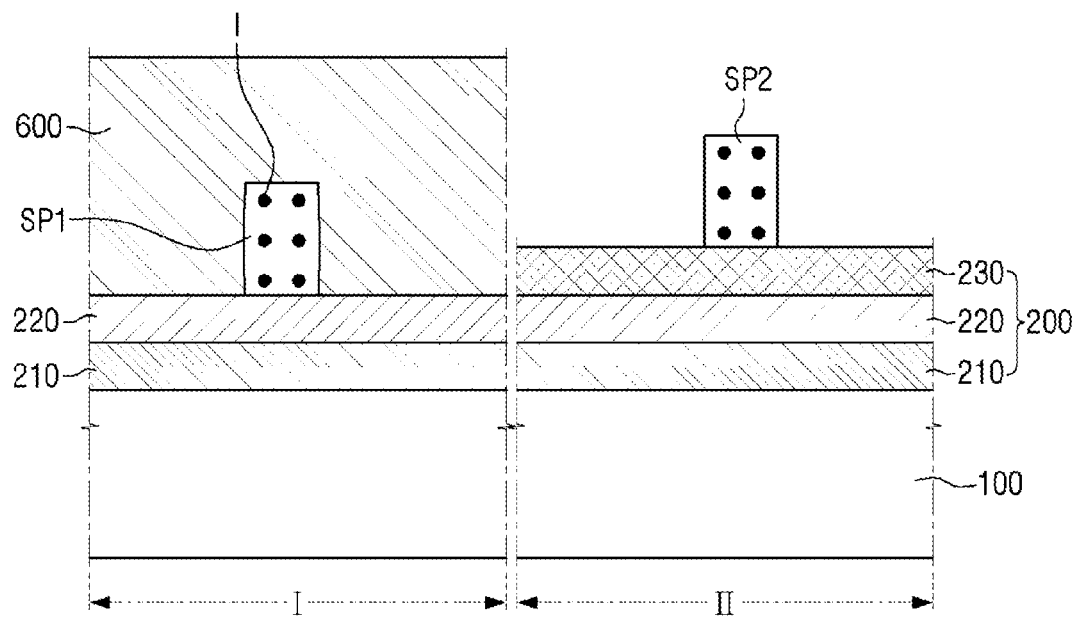

Referring to FIG. 31, compared to the first smooth pattern SP1 in the first region I which is not affected by the plasma treatment 400 due to the presence of the shielding film 600, the first smooth pattern SP1 in the second region II may be changed into the second smooth pattern SP2 by the plasma treatment 400.

Figure 32:
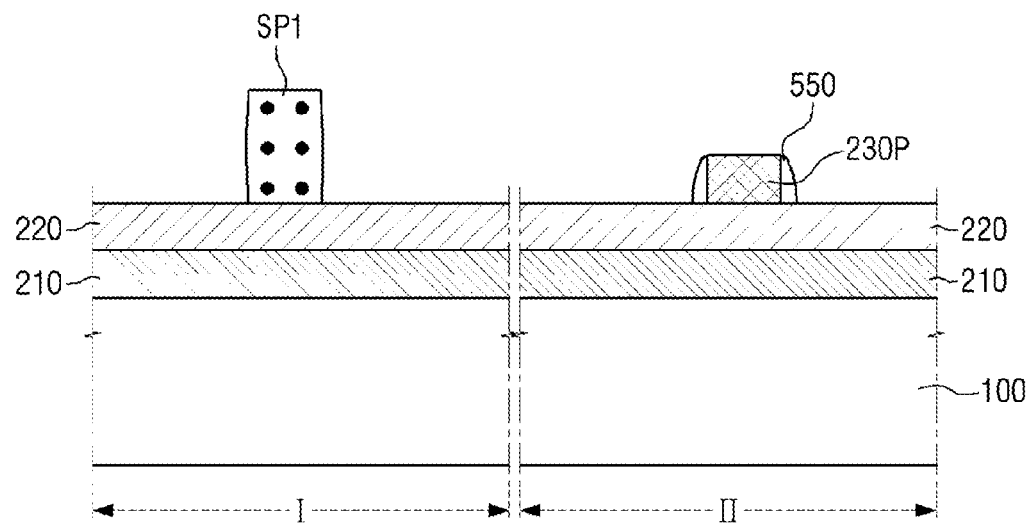

Referring to FIG. 32, the shielding film 600 may be removed from the first region I. In the second region II, the second sacrificial layer 230 may be patterned with the second smooth pattern SP2 as a mask. The second sacrificial layer 230 may be patterned to form the second sacrificial pattern 230P.

The second sacrificial pattern 230P may be transferred by the second smooth pattern SP2 so that it is formed with similar LER. That is, the more the LER of the second smooth pattern SP2 is enhanced, the more the LER of the second sacrificial pattern 230P can be enhanced.

The second spacer 550 may then be formed on both sidewalls of the second sacrificial pattern 230P. That is, the first smooth pattern SP1 may remain on the first sacrificial layer 220 in the first region I, while there may be the second sacrificial pattern 230P and the second spacer 550 positioned on the first sacrificial layer 220 in the second region II. The second spacer 550 may have an etch selectivity to the second sacrificial pattern 230P.

Although not illustrated, trimming process may be added to adjust width of the second spacer 550. The width of the second spacer 550 can determine the interval of the fin-type patterns F1, F2 to be formed later.

The LER of the second spacer 550 may be influenced by the LER of the second sacrificial pattern 230P. Accordingly, as the LER of the second sacrificial pattern 230P is enhanced, the LER of the second spacer 550 can be enhanced.

Figure 33:
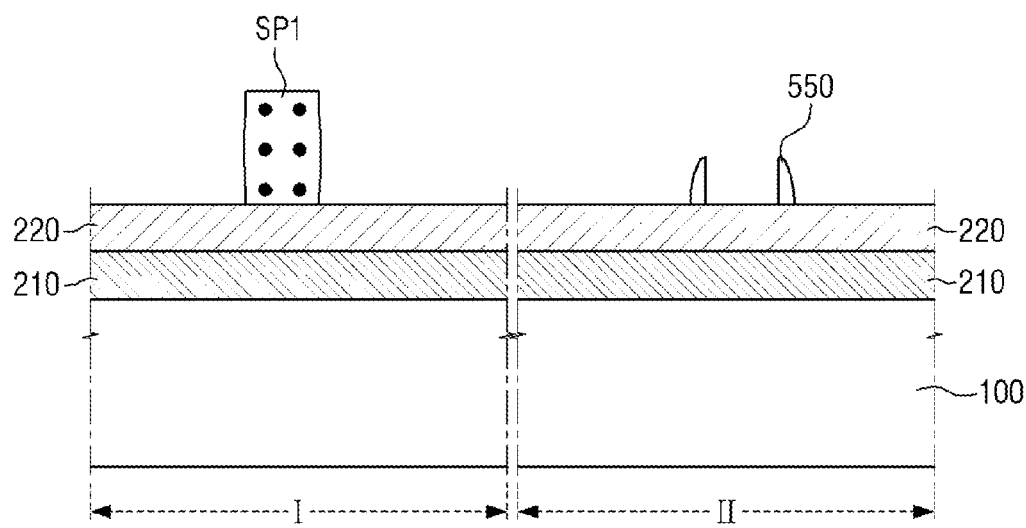

Referring to FIG. 33, the second sacrificial pattern 230P may be removed. As described above, the second sacrificial pattern 230P has an etch selectivity to the second spacer 550. Accordingly, selective removal may be performed so that the second spacer 550 is not removed. With the removal of the second sacrificial pattern 230P, the second spacer 550 may have the interval corresponding to the width of the second sacrificial pattern 230P in the second direction X.

Figure 34:
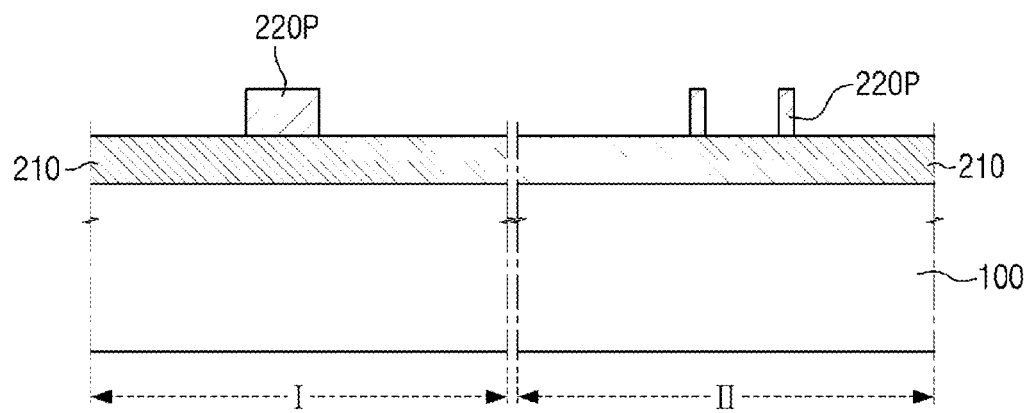

Referring to FIG. 34, the first sacrificial layer 20 may be patterned with the first smooth pattern SP1 as a mask in the first region I, and with the second spacer 550 as a mask in the second region II. The first sacrificial layer 220 may be patterned to form the first sacrificial pattern 20P. The first sacrificial pattern 220P may have a smaller width in the second region II than in the first region I.

The LER of the first sacrificial pattern 220P may be influenced by the LERs of the first smooth pattern SP1 and the second spacer 550. Accordingly, the more the LER of the second spacer 550 is enhanced, the more the LER of the first sacrificial pattern 220P can be enhanced.

Figure 35:
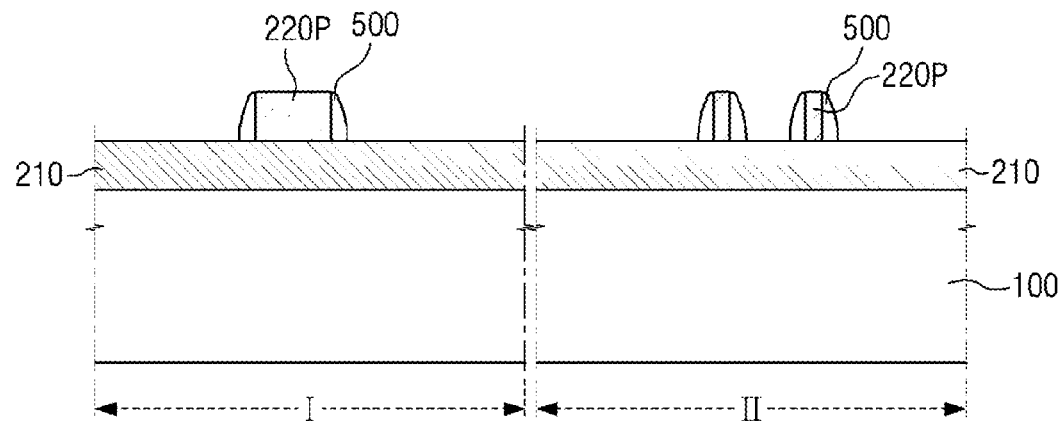

Referring to FIG. 35, a first spacer 500 may be formed on a sidewall of the first sacrificial pattern 220P. The material for the first spacer 500 may include a material with an etch selectivity to the first sacrificial pattern 220P. The first spacer 500 may be formed by patterning the film formed by the atomic layer deposition (ALD). However, example embodiments are not limited to the example given above.

The LER of the first spacer 500 may be influenced by the LER of the first sacrificial pattern 220P. Accordingly, the more the LER of the first sacrificial pattern 220P is enhanced, the more the LER of the first spacer 500 can be enhanced.

Again, trimming process may be added for the first spacer 500 to adjust width in the second direction. The width of the first spacer 500 can determine the width of fin-type patterns F1, F2 which will be formed later.

Figure 36:
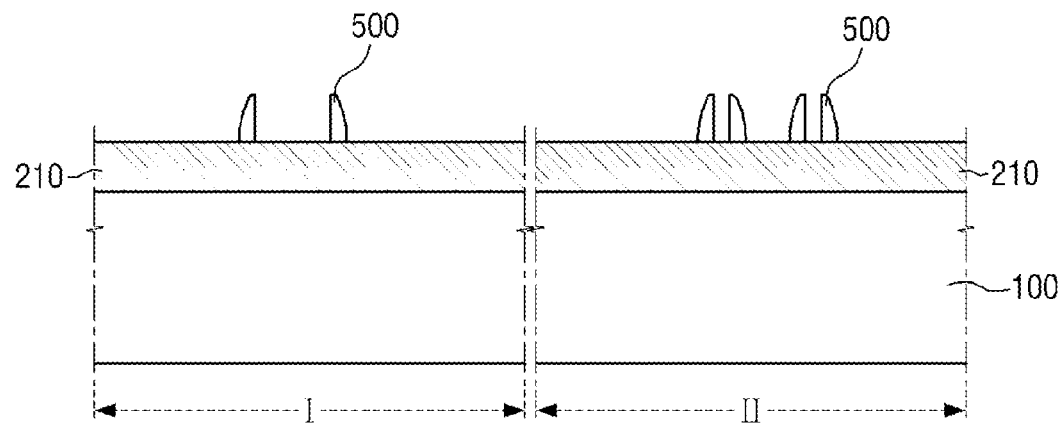

Referring to FIG. 36, the first sacrificial pattern 220P may be removed. As described above, the first sacrificial pattern 220P has an etch selectivity to the first spacer 500. Accordingly, a selective removal may be performed so that the first spacer 500 is not removed. With the removal of the first sacrificial pattern 220P, the first spacer 500 may have the interval corresponding to the width of the first sacrificial pattern 220P in the second direction X.

In this situation, the interval of the first spacers 500 in the first region I may be wider than the interval of the first spacers 500 in the second region II.

Figure 37:
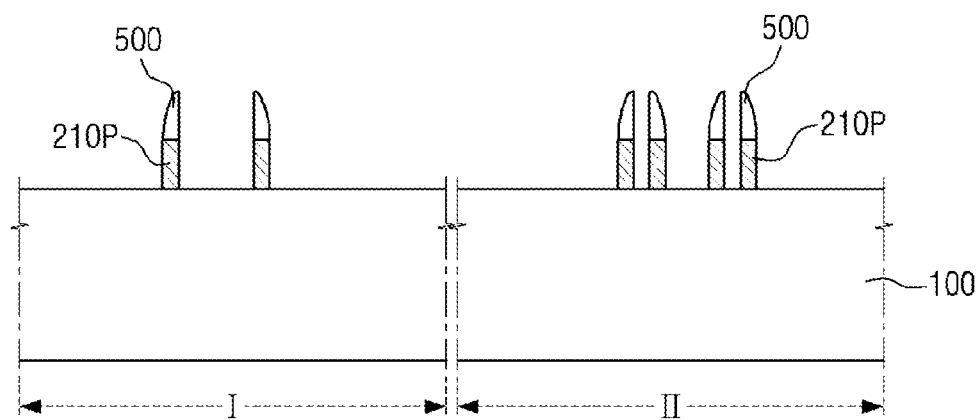

Referring to FIG. 37, the hard mask film 210 may be patterned with the first spacer 500 as a mask. That is, the hard mask film 210 may be selectively removed, leaving only the area overlapped with the first spacer 500. As a result, the hard mask film 210 may be patterned into a hard mask pattern 210P in a bar-shaped pattern. The hard mask pattern 210P may be positioned at a same or similar interval as the first spacer 500.

The LER of the hard mask pattern 210P may be influenced by the LER of the first spacer 500. Accordingly, the more the LER of the first spacer 500 is enhanced, the more the LER of the hard mask pattern 210P can be enhanced.

In this situation, the interval of the hard mask pattern 210P in the first region I may be wider than the interval of the hard mask pattern 210P in the second region II.

Figure 38:
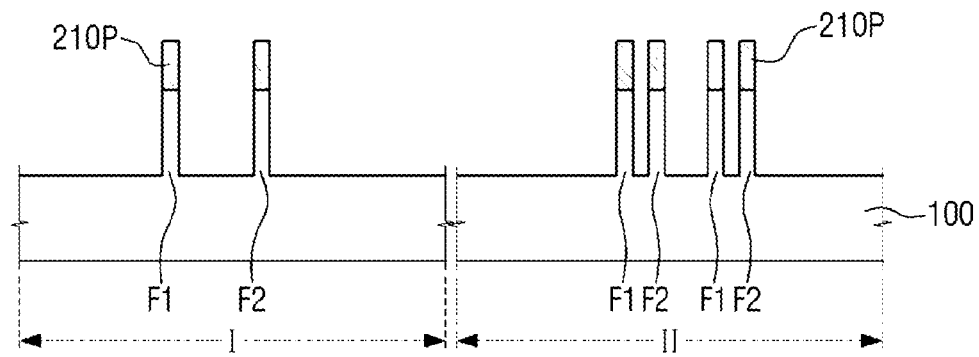

Referring to FIG. 38, the first spacer 500 may be removed, and the substrate 100 may be patterned with the hard mask pattern 210P as a mask so that fin-type patterns F1, F2 are formed.

The fin-type patterns F1, F2 may include a first fin-type pattern F1 and a second fin-type pattern F2. The first fin-type pattern F1 and the second fin-type pattern F2 may respectively correspond to the two first spacers 500 formed on both sidewalls of the first sacrificial pattern 220P. The interval in the second direction X between the first fin-type pattern F1 and the second fin-type pattern F2 may be same as the width of the first sacrificial pattern 220P in the second direction X. Accordingly, the interval between the first fin-type pattern F1 and the second fin-type pattern F2 in the first region I may be wider than the interval between the first fin-type pattern F1 and the second fin-type pattern F2 in the second region II.

The LER of the fin-type patterns F1, F2 may be influenced by the LER of the hard mask pattern 210P. Accordingly, the more the LER of the hard mask pattern 210P is enhanced, the more the LER of the fin-type patterns F1, F2 can be enhanced. That is, as the LER of the rough pattern RP is enhanced to the LERs of the first smooth pattern SP1 and the second smooth pattern SP2, it can be enhanced to the LER of the fin-type patterns F1, F2. In the case of micro pattern forming process such as DPT or QPT process, enhanced LER of the fin-type patterns F1, F2 can result in a reduced risk of short between the fin-type patterns F1, F2. As a result, the reliability of the semiconductor device can be enhanced significantly.

Figure 39:
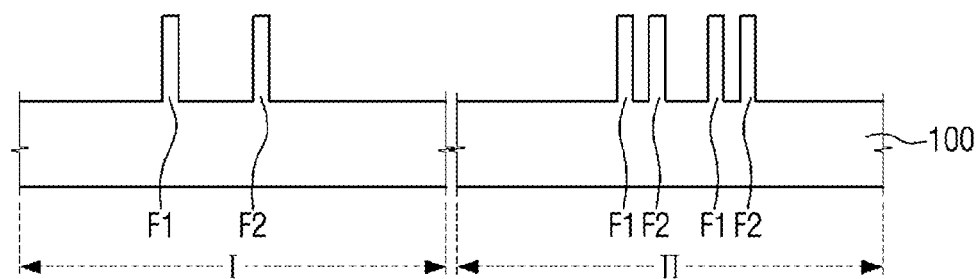

Referring to FIG. 39, the hard mask pattern 210P may be removed. The removal of the hard mask pattern 210P may allow the upper surfaces of the fin-type patterns F1, F2 to be exposed.

The fin cut process may be added after forming of the fin-type patterns F1, F2 to partially remove the fin-type patterns F1, F2. Next, an interlayer insulating film may be so formed as to partially cover the fin-type patterns F1, F2, and a gate electrode may be formed on the fin-type patterns F1, F2 in the second direction X. A transistor may then be formed by forming source/drain on both sides of the gate electrode in the first direction Y.

According to example embodiments of the present disclosure, relatively high LER enhancement can be obtained at a portion such as QPT portion where the micro pattern is formed by performing the ion implantation 300 and the plasma treatment 400 together, while the LER enhancement can be obtained by the ion implantation 300 only (i.e., without plasma treatment 400) at a DPT processing portion having less degree of pattern fineness than QPT to thus achieve uniformity of the fabricating process.

Figure 40:
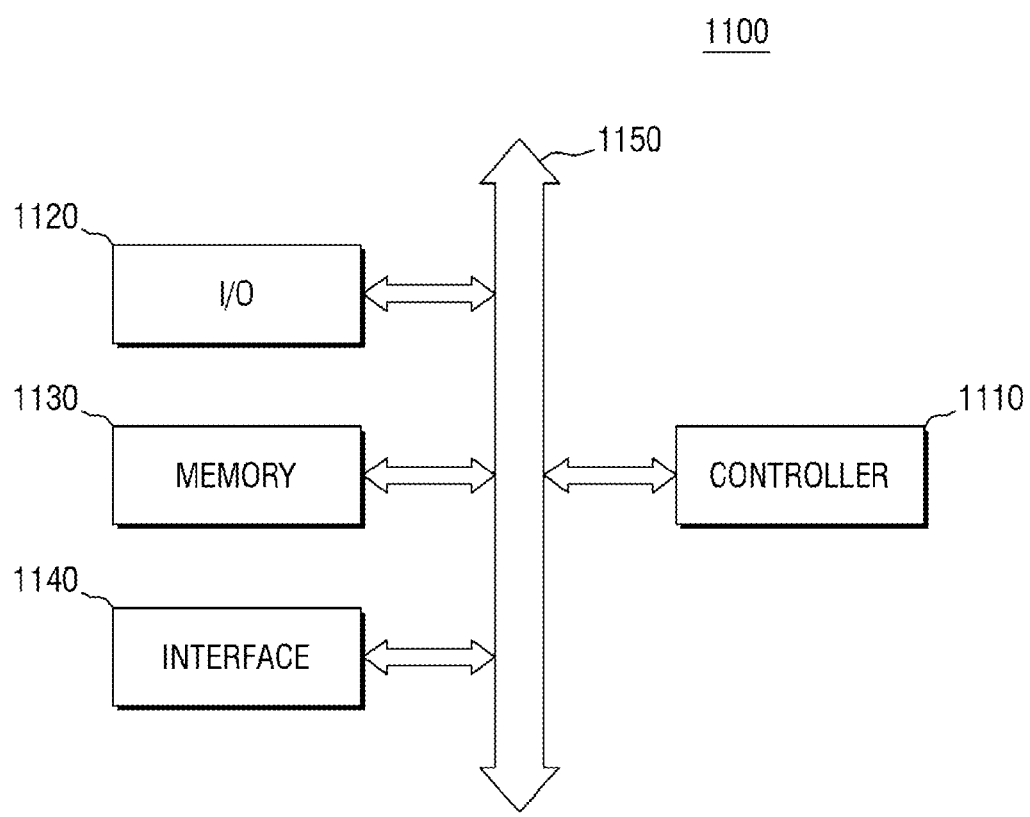

FIG. 40 is a block diagram of an electronic system comprising a semiconductor device fabricated according to a method for fabricating a semiconductor device according to some example embodiments.

Referring to FIG. 40, an electronic system 1100 according to some example embodiments may include a controller 1110, an input/output (I/O) device 1120, a memory device 1130, an interface 1140 and a bus 1150. The controller 1110, the I/O device 1120, the memory device 1130 and/or the interface 1140 may be coupled with one another via the bus 1150. The bus 1150 corresponds to a path through which data travels.

The controller 1110 may include at least one of microprocessor, digital signal process, micro controller and logic devices capable of performing functions similar to those mentioned above. The I/O device 1120 may include a keypad, a keyboard, a display device and so on. The memory device 1130 may store data and/or commands. The interface 1140 may perform a function of transmitting or receiving data to or from communication networks. The interface 1140 may be wired or wireless. For example, the interface 1140 may include an antenna or a wired/wireless transceiver.

Although not illustrated, the electronic system 1100 may additionally include an operation memory configured to enhance operation of the controller 1110, such as a high-speed dynamic random-access memory (DRAM) and/or a static random access memory (SRAM).

According to the example embodiments described above, the semiconductor device may be provided within the memory device 1130, or provided as a part of the controller 1110, the I/O device 1120, and so on.

The electronic system 1100 is applicable to a personal digital assistant (PDA) portable computer, a web tablet, a wireless phone, a mobile phone, a digital music player, a memory card, or almost all electronic products that are capable of transmitting and/or receiving data in wireless environment.

While the present inventive concepts have been particularly shown and described with reference to example embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the invention.

What is claimed is:

1. A method for fabricating a semiconductor device, comprising:
   forming a composite film on a substrate, the substrate including a semiconductor material;
   forming a rough pattern on the composite film;
   forming a first smooth pattern by subjecting the rough pattern to ion implantation;
   forming a second smooth pattern by subjecting the first smooth pattern to a plasma treatment; and
   patterning the composite film using the second smooth pattern as a first mask.

2. The method of claim 1, wherein the rough pattern has a line edge roughness (LER) greater than a LER of the second smooth pattern.

3. The method of claim 1, wherein the subjecting the rough pattern to ion implantation includes applying ions selected from at least one of C, Ar, $H_2$ and $O_2$ to the rough pattern.

4. The method of claim 1, wherein the subjecting the first smooth pattern to the plasma treatment comprises using HBr or He plasma.

5. The method of claim 1, wherein the ion implantation and the plasma treatment are performed in-situ.

6. The method of claim 1 wherein the forming the rough pattern comprises forming an amorphous carbon layer (ACL).

7. The method of claim 6, wherein the forming the rough pattern comprises depositing the rough pattern by chemical vapor deposition (CVD).

8. The method of claim 1, wherein
the forming the composite film comprises forming a hard mask film and a first sacrificial layer on the hard mask film, and
the patterning the composite film using the second smooth pattern as the first mask comprises,
    forming a first sacrificial pattern by patterning the first sacrificial layer,
    forming a first spacer on a sidewall of the first sacrificial pattern, and
    patterning the hard mask film using the first spacer as a second mask.

9. The method of claim 8, wherein
the forming the composite film further comprises forming a second sacrificial layer on the first sacrificial layer, and
the forming the first sacrificial pattern comprises,
    forming a second sacrificial pattern by patterning the second sacrificial layer using the second smooth pattern as the first mask, and
    forming a second spacer on a sidewall of the second sacrificial pattern, and wherein the forming the first sacrificial pattern by patterning the first sacrificial layer includes using the second spacer as a third mask.

10. The method of claim 1, wherein the forming the rough pattern comprises forming a photo resist (PR).

11. The method of claim 10, wherein the forming the rough pattern comprises,
forming a mask film on the composite film,
forming a shielding film partially exposing the mask film, and
subjecting the exposed mask film to exposure.

12. The method of claim 11, wherein the subjecting the exposed mask film to exposure comprises irradiating an argon fluoride (ArF) laser or an extreme ultra violet (EUV) laser.

13. A method for fabricating a semiconductor device, comprising:
forming a hard mask film and a first sacrificial layer sequentially on a substrate, the substrate including a semiconductor material;
forming a rough pattern on the first sacrificial layer;
forming a first smooth pattern by subjecting the rough pattern to ion implantation;
forming a second smooth pattern by subjecting the first smooth pattern to a plasma treatment;
forming a first sacrificial pattern by patterning the first sacrificial layer using the second smooth pattern as a first mask;
forming a first spacer on a sidewall of the first sacrificial pattern;
forming a hard mask pattern by patterning the hard mask film using the first spacer as a second mask; and
forming a first fin-type pattern and a second fin-type pattern by patterning the substrate using the hard mask pattern as a third mask, a distance between the first fin-type pattern and the second fin-type pattern being equal to a width of the first sacrificial pattern.

14. The method of claim 13, further comprising:
forming a second sacrificial layer on the first sacrificial layer, the rough pattern being formed on the second sacrificial layer,
the forming the first sacrificial pattern including,
    forming a second sacrificial pattern by patterning the second sacrificial layer using the second smooth pattern as the first mask, and
    forming a second spacer on a sidewall of the second sacrificial pattern, the forming a first sacrificial pattern by patterning the first sacrificial layer further includes using the second spacer as a third mask.

15. The method of claim 13, further comprising:
forming a second sacrificial layer on the first sacrificial layer in a first region of the substrate, the rough pattern being formed on the second sacrificial layer, and
the forming a first sacrificial pattern including,
    forming, in the first region, a second sacrificial pattern by patterning the second sacrificial layer using the first smooth pattern as a third mask,
    forming a second spacer on a sidewall of the second sacrificial pattern, the forming a first sacrificial pattern by patterning the first sacrificial layer further includes using the second spacer as a fourth mask, and forming, in a second region, a first sacrificial pattern by patterning the first sacrificial layer using the second smooth pattern as a fifth mask.

16. A method of fabricating a semiconductor device, comprising:
reducing a line edge roughness (LER) of a rough pattern by using ion implantation on the rough pattern to form a first smooth pattern and using a plasma treatment on the first smooth pattern to form a second smooth pattern, the rough pattern being on a composite film, and the composite film being on a substrate, the substrate including a semiconductor material;
patterning the composite film using the second smooth pattern as a first mask to form a composite pattern; and
patterning the substrate using the composite pattern as a second mask to form a fin-type pattern.

17. The method of claim 16, further comprising:
providing a first rough pattern on a first region of the composite film, the first region including a first sacrificial layer and a hard mask film; and
providing a second rough pattern on a second region of the composite film, the second region including a second sacrificial layer, the first sacrificial layer, and the hard mask film, and the reducing a line edge roughness (LER) of the rough pattern includes,
    reducing a LER of the first and second rough patterns by implanting ions in the first and second rough patterns to form the first smooth pattern and the second smooth pattern, respectively,
    providing a shielding film over the first smooth pattern, and reducing a LER of the second smooth pattern by performing the plasma treatment on the second smooth pattern.

* * * * *